(12) United States Patent
Chaji

(10) Patent No.: US 11,322,556 B2
(45) Date of Patent: May 3, 2022

(54) METHOD OF INTEGRATING FUNCTIONAL TUNING MATERIALS WITH MICRO DEVICES AND STRUCTURES THEREOF

(71) Applicant: VueReal Inc., Waterloo (CA)

(72) Inventor: Gholamreza Chaji, Waterloo (CA)

(73) Assignee: Vue Real Inc., Waterloo (CA)

( * ) Notice: Subject to any disclaimer, the term of this patent is extended or adjusted under 35 U.S.C. 154(b) by 0 days.

(21) Appl. No.: 17/346,457

(22) Filed: Jun. 14, 2021

(65) Prior Publication Data

US 2021/0305327 A1    Sep. 30, 2021

Related U.S. Application Data

(63) Continuation of application No. 16/901,828, filed on Jun. 15, 2020, which is a continuation of application No. 16/420,580, filed on May 23, 2019, now Pat. No. 10,707,277, which is a continuation-in-part of
(Continued)

(51) Int. Cl.
*H01L 27/32* (2006.01)
*G02B 5/20* (2006.01)
*G02F 1/017* (2006.01)
*G09G 3/3225* (2016.01)
(Continued)

(52) U.S. Cl.
CPC .............. *H01L 27/322* (2013.01); *G02B 5/20* (2013.01); *G02F 1/017* (2013.01); *G09G 3/3225* (2013.01); *H01L 27/326* (2013.01); *H01L 27/3246* (2013.01); *H01L 51/5096* (2013.01); *H01L 51/5203* (2013.01); *H01L 51/5262* (2013.01); *H01L 51/5284* (2013.01); *G02F 1/01791* (2021.01); *G09G 2300/0452* (2013.01); *G09G 2300/08* (2013.01); *H01L 2251/5307* (2013.01)

(58) Field of Classification Search
CPC . H01L 27/322; H01L 27/3246; H01L 27/326; H01L 51/5096; H01L 51/5203; H01L 51/5262; H01L 51/5284; H01L 2251/5307; H01L 51/5271; G02B 5/20; G02F 1/017; G02F 1/01791; G09G 3/3225; G09G 2300/0452; G09G 2300/08
See application file for complete search history.

(56) References Cited

U.S. PATENT DOCUMENTS

| 6,335,548 | B1 | 1/2002 | Roberts |
| 7,703,945 | B2 | 4/2010 | Leung |
| 8,750,671 | B1 | 6/2014 | Kelly |

(Continued)

OTHER PUBLICATIONS

International Search Report and Written Opinion in International Patent Application No. PCT/IB2017/056098, dated Jan. 15, 2018 (12 pages).

(Continued)

*Primary Examiner* — Donald L Raleigh
(74) *Attorney, Agent, or Firm* — Nixon Peabody LLP

(57) ABSTRACT

The disclosure is related to creating different functional micro devices by integrating functional tuning materials and creating an encapsulation capsule to protect these materials. Various embodiments of the present disclosure also related to improve light extraction efficiencies of micro devices by mounting micro devices at a proximity of a corner of a pixel active area and arranging QD films with optical layers in a micro device structure.

12 Claims, 36 Drawing Sheets

Related U.S. Application Data application No. 15/724,319, filed on Oct. 4, 2017, now Pat. No. 10,312,296.

(60) Provisional application No. 62/768,771, filed on Nov. 16, 2018, provisional application No. 62/403,742, filed on Oct. 4, 2016.

(51) Int. Cl.
  H01L 51/52 (2006.01)
  H01L 51/50 (2006.01)

(56) References Cited

U.S. PATENT DOCUMENTS

| | | |
|---|---|---|
| 2001/0000622 A1 | 5/2001 | Reeh |
| 2001/0033135 A1 | 10/2001 | Duggal |
| 2002/0063517 A1 | 5/2002 | Hosokawa |
| 2005/0084775 A1 | 4/2005 | Kawaguchi |
| 2006/0105480 A1 | 5/2006 | Boardman |
| 2006/0138453 A1 | 6/2006 | Thompson |
| 2006/0138941 A1 | 6/2006 | Wittman |
| 2009/0086466 A1 | 4/2009 | Sugita |
| 2009/0086508 A1 | 4/2009 | Bierhuizen |
| 2009/0121241 A1 | 5/2009 | Keller |
| 2010/0045175 A1 | 2/2010 | Mathai |
| 2010/0102340 A1 | 4/2010 | Ooya |
| 2010/0213474 A1 | 8/2010 | Hsu |
| 2011/0025951 A1 | 2/2011 | Jones |
| 2011/0204390 A1* | 8/2011 | Lerman ............... F21K 9/64 257/88 |
| 2013/0034328 A1 | 2/2013 | Galeotti |
| 2014/0063846 A1 | 3/2014 | Lu |
| 2014/0077245 A1 | 3/2014 | Won |
| 2014/0167599 A1* | 6/2014 | Sugiura ............ H01L 33/504 313/498 |
| 2014/0362579 A1 | 12/2014 | Noh |
| 2015/0124188 A1 | 5/2015 | Kadowaki |
| 2015/0160394 A1 | 6/2015 | Nakano |
| 2015/0373793 A1 | 12/2015 | Bower |
| 2016/0155882 A1 | 6/2016 | Tian |
| 2017/0023828 A1 | 1/2017 | Lee |
| 2017/0092863 A1 | 3/2017 | Bower |
| 2017/0122502 A1 | 5/2017 | Cok |
| 2017/0162553 A1* | 6/2017 | Bibl ................ H01L 33/507 |
| 2017/0256522 A1 | 9/2017 | Cok |
| 2018/0059484 A1 | 3/2018 | Murai |

OTHER PUBLICATIONS

International Search Report and Written Opinion in International Patent Application No. PCT/IB2020/054937, dated Sep. 3, 2020 (16 pages).

* cited by examiner

METHOD OF INTEGRATING FUNCTIONAL TUNING MATERIALS WITH MICRO DEVICES AND STRUCTURES THEREOF

CROSS-REFERENCE TO RELATED APPLICATIONS

This application is a continuation of U.S. Non-Provisional patent application Ser. No. 16/901,828, filed Jun. 15, 2020, which is a continuation of U.S. Non-Provisional Patent Application Ser. No. 16/420,850, filed May 23, 2019, now U.S. Pat. No. 10,707,277, issued Jul. 7, 2020, which is a continuation-in-part of U.S. Non-Provisional patent application Ser. No. 15/724,319, filed on Oct. 4, 2017, now U.S. Pat. No. 10,312,296, issued Jun. 4, 2019, which claims priority to and the benefit of U.S. Provisional Patent Application Ser. No. 62/403,742, filed Oct. 4, 2016, which are incorporated herein by reference in their entireties. This application also claims priority from U.S. Provisional Patent Application Ser. No. 62/768,771, filed Nov. 16, 2018, which is incorporated herein by reference in its entirety.

TECHNICAL FIELD

The present invention relates to an integration of color conversion layers into a display substrate. More particularly, the present invention relates to provide an encapsulation capsule to protect the color conversion layers from environmental agents. The present invention also relates to methods and structures to improve light extraction efficiencies of micro devices by mounting micro devices at a proximity of a corner of a pixel active area covered by color conversion layers.

BACKGROUND

System performance can be enhanced by integrating different micro devices into a system substrate. The challenge is that different micro devices can have different performance and also use different material systems. These material systems are in general sensitive to environmental agents (e.g., oxygen or water). Therefore, it is desirable to provide protection to these materials to enhance system performance.

SUMMARY OF THE INVENTION

Accordingly, the present invention relates to a pixel structure comprising: a light source to generate light; a light conversion layer to convert the light to a desired color; and a light distribution structure to distribute the light from the light source onto the conversion layer.

In one embodiment, other layers can be also integrated between the light distributor layer and light source. Also, other layers can be integrated after the light conversion (e.g., quantum dot (QD)) layers.

In another embodiment, to avoid high stress points in the light conversion layer caused by high intensity light, an attenuator or blocking structure is used to reduce or block the light intensity from a direct line of sight between the light source and the light conversion (e.g., QD) layer.

In one embodiment, the light distributor is comprised of a light guide.

In another embodiment, the light distributor is comprised of reflective layers and a planarization layer.

In another embodiment, the light attenuator structure is also used as the light source electrode.

In another embodiment, the light attenuator structure is part of the light distributor structure reflective layers.

In an embodiment, the reflective layer is used as part of the light source contact.

In an embodiment, the light distribution structure comprises a thick transparent layer on top of the light source.

Another aspect of this invention is creating an encapsulation capsule to protect color conversion materials.

According to one embodiment, there is provided an optoelectronic device comprising a plurality of semiconductor layers formed on a substrate that form a top surface and a bottom surface, wherein the plurality of semiconductor layers have isolated areas that form at least one side surface, one or more cover layers form a space around the isolated areas optically coupled to the at least one side surface; and functional tuning materials disposed in the space formed by the one or more cover layers.

According to one embodiment, a pixel structure for a display may be provided. The pixel structure may comprising a substrate, a light source (e.g., a micro device) mounted at the proximity of a corner of a pixel active area or pixel active side to generate light, a color conversion layer and/or color filters may be formed on the micro device to convert the light to a desired color and a top reflector mounted on the color conversion layer and extended over the top of the area of the micro device to reflect the light back toward and through the color conversion layer. The pixel active area is where the light generation or light conversion happens. The pixel active area can be the same as the pixel area.

According to other embodiments, a LED device structure may be provided. The structure may comprise optical layers coupling the LED lights into the structure and reflect the light created by QD layers towards the optical layers.

BRIEF DESCRIPTION OF THE DRAWINGS

The invention will be described in greater detail with reference to the accompanying drawings which represent preferred embodiments thereof, wherein.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Embodiments in the present disclosure are related to the integration of a color conversion layer (e.g., QDs) into an optical substrate system, typically used in color displays. The optical substrate may comprise one or more: micro light emitting diodes (LEDs), organic LEDs, sensors, solid state devices, integrated circuits, microelectromechanical systems (MEMS), and other electronic components. The receiving substrate may be, but is not limited to, a printed circuit board (PCB), a thin-film transistor (TFT) backplane, an integrated circuit substrate, or, in one case of optical micro devices, such as LEDs, a component of a display, for example a driving circuitry backplane.

In this disclosure, the structure is described using microLED and color conversion layers. However, a similar structure can be used with other micro devices and other functional tuning materials.

The shape of the light sources used in the embodiments are for illustration purposes and may have different shapes and sizes. The light source devices may have one or more pads on the side that will contact the receiver substrate. The pads may be mechanical, electrical or a combination of both. The one or more pads may be connected to a common electrode or to a row/column of electrodes. The electrodes may be transparent or opaque. The light sources may have different layers. The light sources may be made of different materials, such as organic, inorganic, or a combination thereof.

Figure 1:
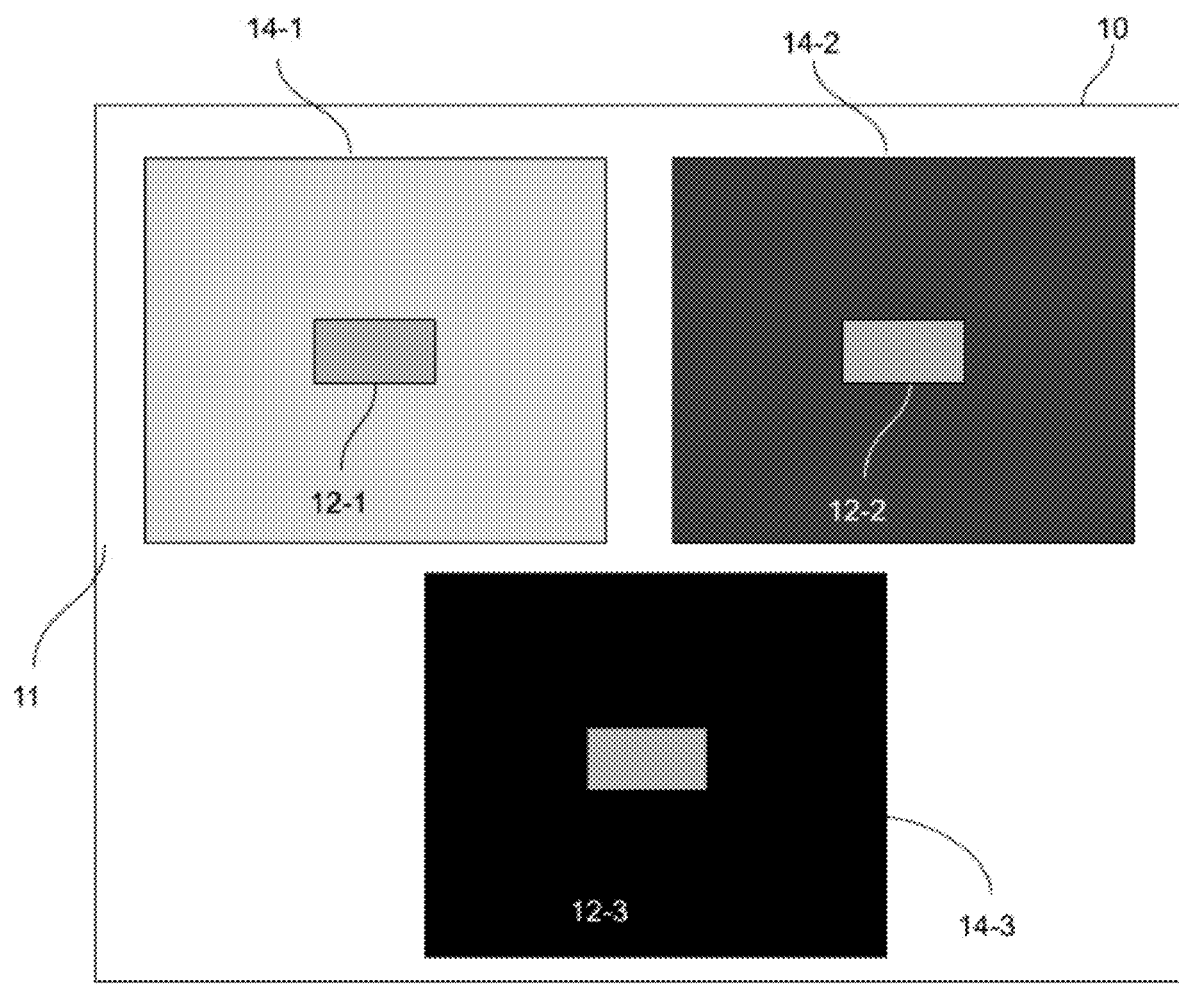
FIG. 1 illustrates an embodiment of a color conversion layer on top of the light source in the pixel.

FIG. 1 illustrates a pixel structure 10 in accordance with an embodiment of the present invention including a substrate 11 with three subpixels defined by light sources 12-1, 12-2, and 12-3 mounted thereon with color conversion layers 14-1, 14-2, 14-3 (e.g., QD layers) mounted thereover. One of the light sources 12-1, 12-2, or 12-3 may have no color conversion layer. For example, if a blue light source is used, the blue subpixel may not include a color conversion layer. Here, other layers may be used on top of the color conversion layers 14-1, 14-2, and 14-3, such as encapsulation, a color filter, or electrodes for a touch interface. The following description may use one subpixel 12-1, 12-2, or 12-3 to explain the invention, but the invention may be easily extended to a plurality of subpixels (e.g., 2 to 5) and a plurality of pixels for an entire display.

Figure 2A:
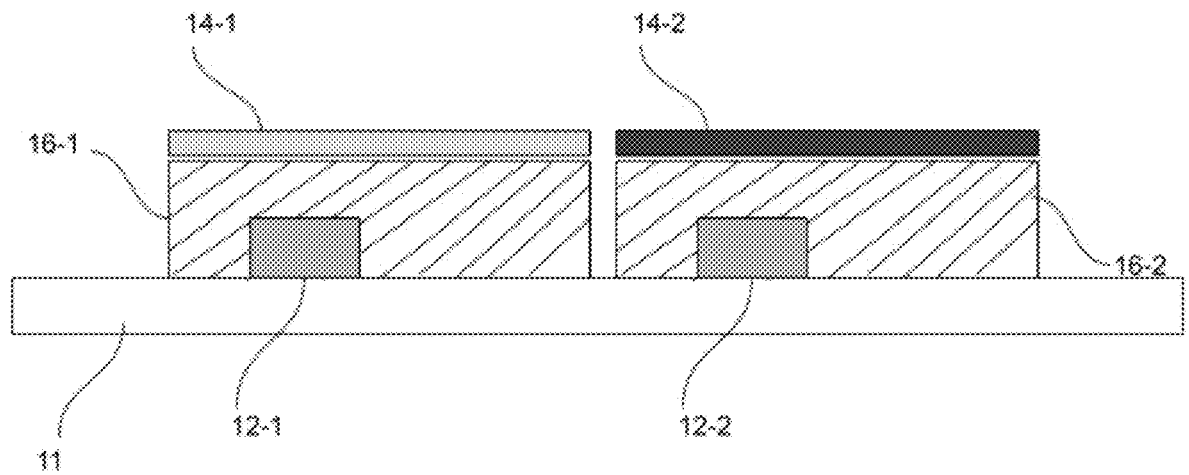
FIG. 2A illustrates an example of implementing a light distribution structure between a light source and a color conversion layer.
Figure 2B:
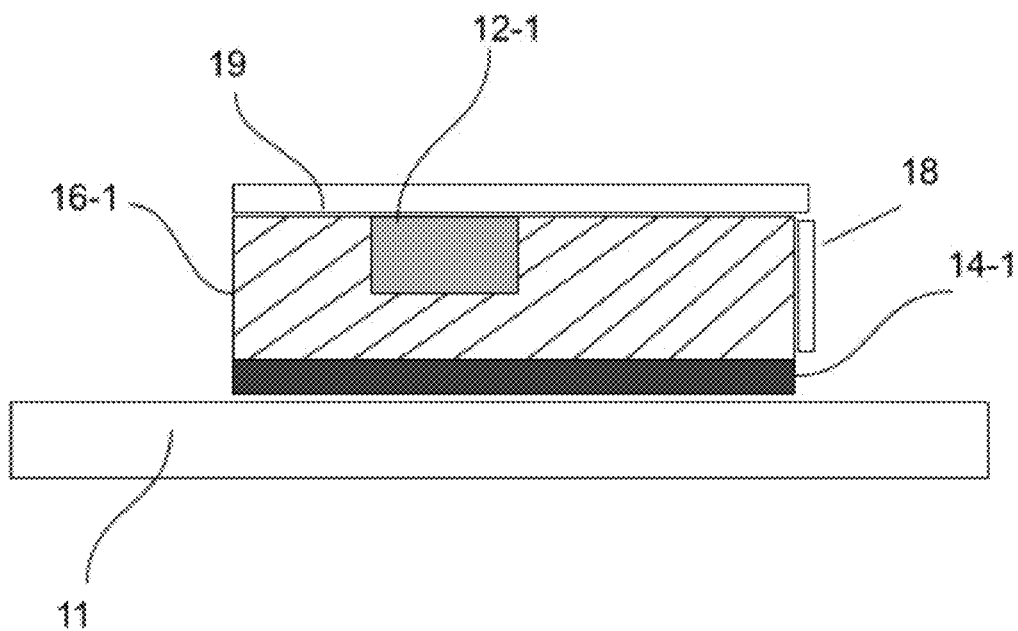
FIG. 2B illustrates another example of implementing a light distribution structure between a light source and a color conversion layer.
Figure 2C:
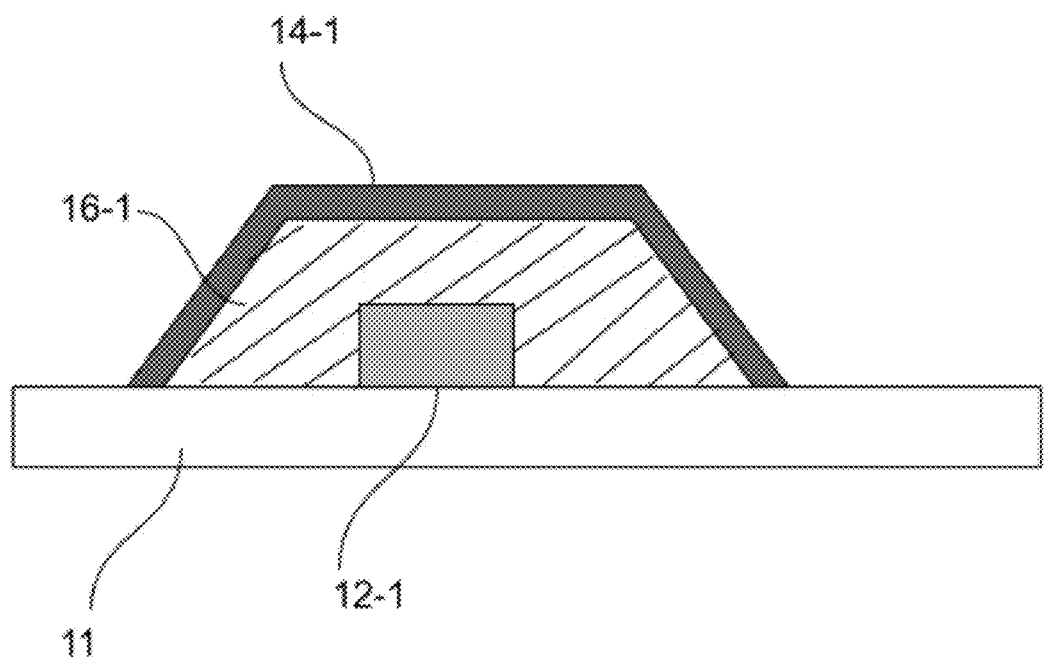
FIG. 2C illustrates another example of implementing a light distribution structure between a light source and a color conversion layer.

FIGS. 2A to 2C illustrate exemplary embodiments of the display substrate 11 that includes the light sources 12-1 and 12-2, and respective light distribution structures 16-1 and 16-2 to distribute the light before reaching the respective color conversion layers 14-1 and 14-2. The light distribution structures may comprise transparent polymer materials, such as: methyl methacrylate styrene (MS) resins with low density, low moisture absorption, and good moldability; methyl methacrylate butadiene styrene (MBS) resins with a good balance of transparency, strength and fluidity; and transparent acrylonitrile butadiene styrene (ABS) resins. However, other high refractive index (e.g., >1.5) transparent polymer materials may be used, ideally matching the index of the micro device material.

There may be pixel circuits (not shown) on the substrate 11, which may include TFTs. There may also be a planarization layer between the pixel circuits and the light sources 12-1 and 12-2. An electrode or electrodes may connect the pixel circuits to the light source 12-1 and 12-2. In one embodiment, FIG. 2A, the light is distributed and directed away from the substrate 11 to the location of the color conversion layers 14-1 and 14-2. In another embodiment, FIG. 2B, the light is directed toward and through the substrate 11, which comprises a material transparent to the particular wavelengths of the light. In this case, the light conversion layer 14-1 may be located on the substrate 11, with the light distribution structure 16-1 on the light conversion layer 14-1, and between the light source 12-1 and the light conversion layers 14-1. The light conversion layer (or layers) 14-1 may be located on the other side of the substrate 11 opposite the light sources 12-1. There may also be a planarization layer before the light distribution structures 16-1.

Figure 7:
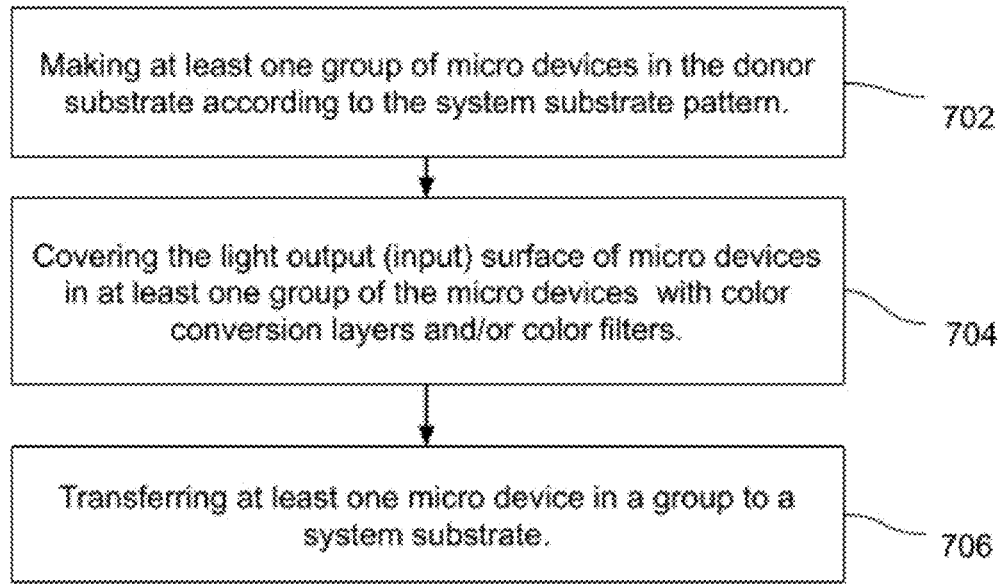
FIG. 7 illustrates a flow diagram for a method in accordance with an embodiment of the present invention.

With reference to FIG. 7, the method to manufacture the pixel circuit comprises: step 702, making at least one group of micro devices 12-1 and 12-2 on a donor substrate 11 according to a system substrate pattern; step 704, covering the light output (input) surface of the micro devices 12-1 and 12-2 with the color conversion layers 14-1 and 14-2 and/or color filters; and step 706, transferring at least one of the micro devices 12-1 and 12-2 in a group to a system substrate.

The light distribution structure 16-1 may be a thick transparent layer, as hereinabove described. In one example, the layer may be more than 3 μm. In another example, the side of the transparent layer may be blocked by an opaque or reflective layer(s) 18 for each pixel or subpixel. In another example, there may be a reflective layer 19 behind or on top of the light source 12-1.

With reference to FIG. 2C, the sides of the light distribution structure 16-1 may be formed (e.g., etched) at an internal acute angle to the substrate 11 to form a frusto-pyramidal or frusto-conical structure. The acute angle may be between 30° and 60°, but preferably between 40° and 50°, to let light be directed outwardly from the light source 12-1 at 180°. Similarly, the color conversion layer 14-1 would cover the angled sides and the top of the light distribution structure 16-1.

Figure 3A:
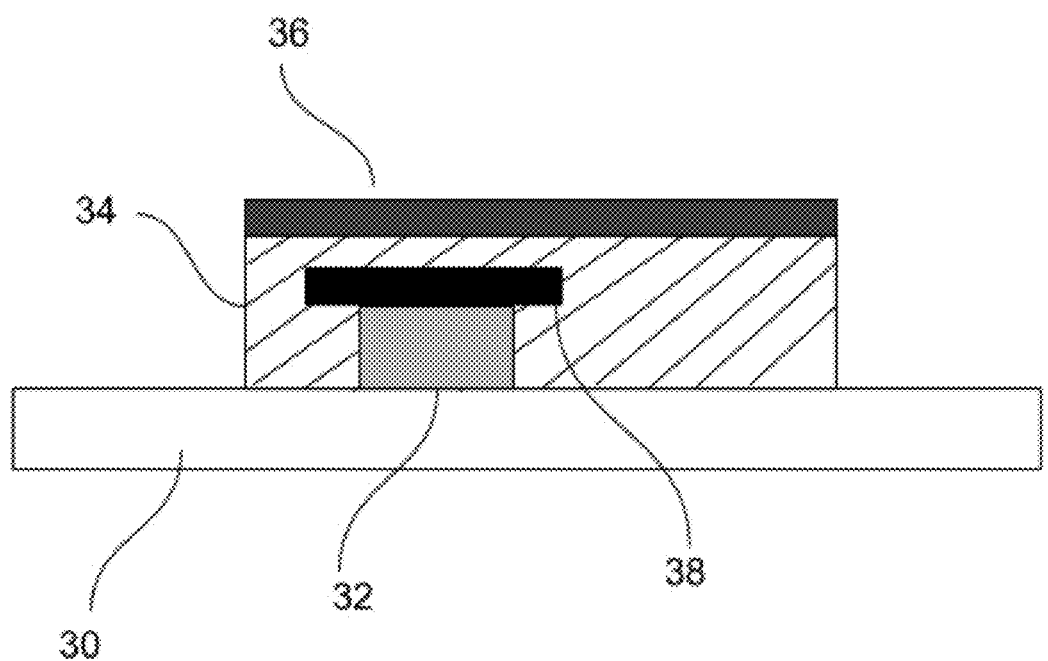
FIG. 3A illustrates an example of implementing a light distribution structure and a light attenuator between a light source and a color conversion layer.
Figure 3B:
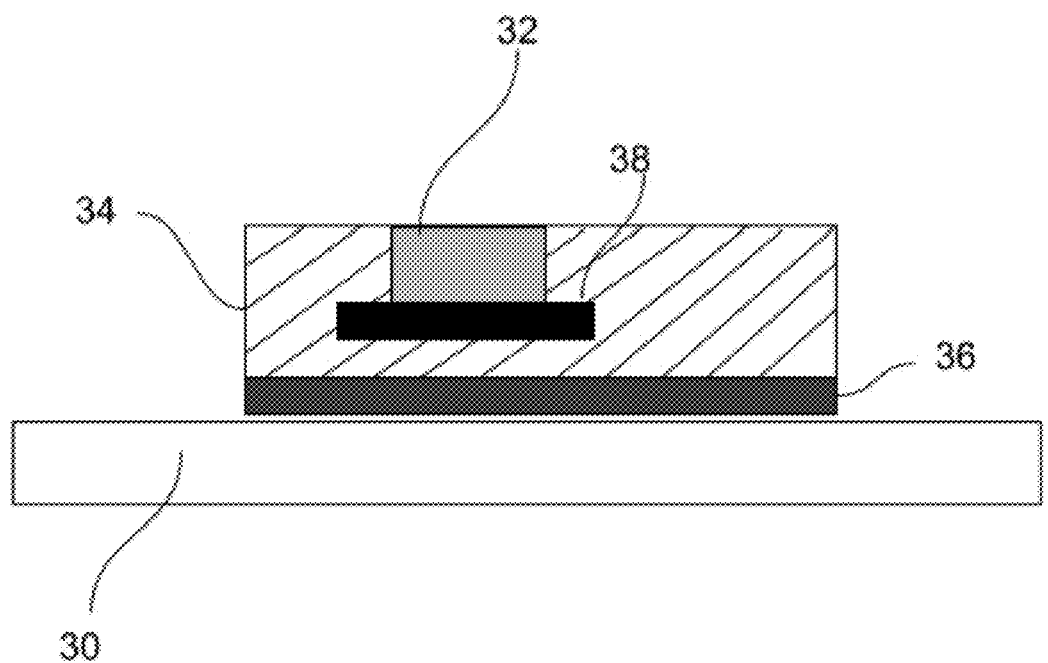
FIG. 3B illustrates another example of implementing a light distribution structure and a light attenuator between a light source and a color conversion layer.

However, the thickness of the light distribution structure 16-1 may be too large, if the ratio of pixel area to light source area is too big. To eliminate the need for a thick light distribution structure 16-1, FIGS. 3A and 3B illustrate embodiments including a light distribution structure 34 with a light attenuator 38 mounted thereon for reducing the hot spot effect. The light attenuator 38 reduces the light intensity from a direct line of sight from a light source 32. In the illustrated embodiment, the attenuator 38 may be comprised of a material opaque to the wavelength of the light thereby blocking direct light from the light source from hitting the light conversion layer 36. The attenuator structure 38 may act as the contact or electrode of the light source 32. The light attenuator 38 may include at least one of a semi-transparent, opaque, and a reflective layer. The attenuator 38 may also be an optical structure that redirects the light. The light attenuator 38 may be a part of the light distribution layer 34. The light attenuator structure 38 may be directly on top of the light source 32 or there may be other layers between the light source 32 and the light attenuator structure 38. There may be layers (e.g., of the light distribution structure 34) between the light attenuator structure 38 and the light conversion layer 36. The attenuator 38 may be directly on or connected to the light conversion layer 36. Also, the light conversion layer 36 may cover the whole or part of the area over the light attenuator structure 38. FIG. 3B illustrates an alternate embodiment, in which the light source 32 directs the light through the substrate 30, which is transparent to wavelengths in the light, whereby the light conversion layer 36 may be mounted directly on or over the substrate 30, with the light distribution layer 34 and the attenuator 38 mounted between the light conversion layer 36 and the light source 32.

Figure 8:
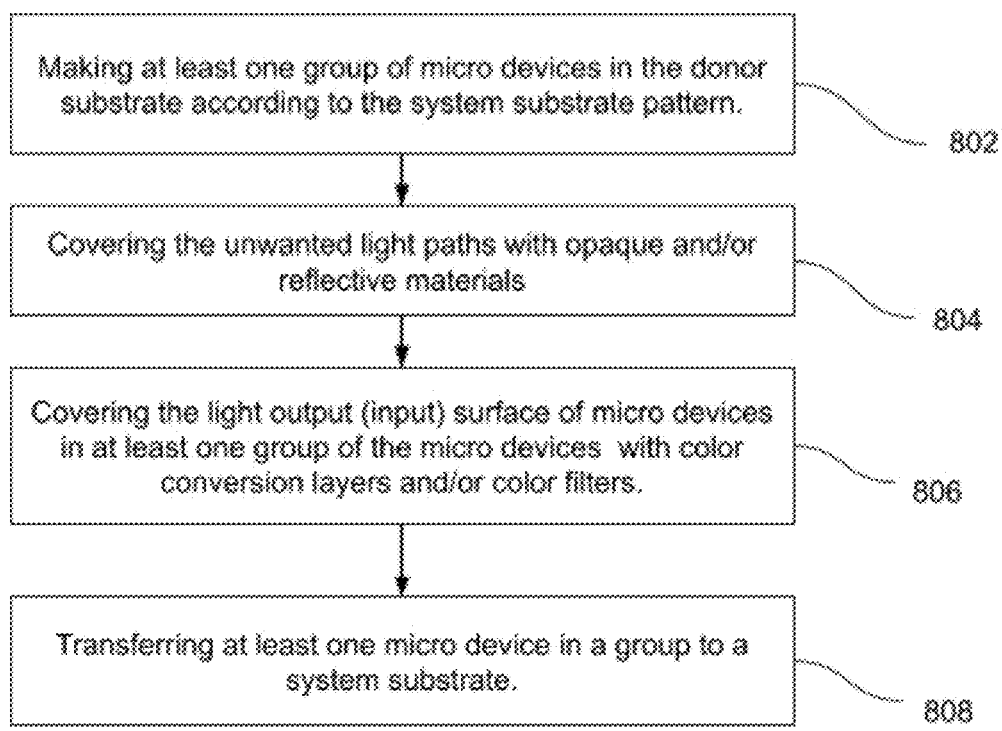
FIG. 8 illustrates a flow diagram for an alternative method in accordance with an embodiment of the present invention.

With reference to FIG. 8, the method to manufacture the pixel circuit comprises: step 802, making at least one group of micro devices 32 on a donor substrate 30 according to a system substrate pattern; step 804, covering or blocking undesired light paths from the micro devices 32 with opaque or reflective materials (e.g., light attenuator 38); step 806, covering the light output (input) surface of the micro devices 32 with the color conversion layers 36 and/or color filters; and step 808, transferring at least one of the micro devices 32 in a group to a system substrate.

Figure 4A:
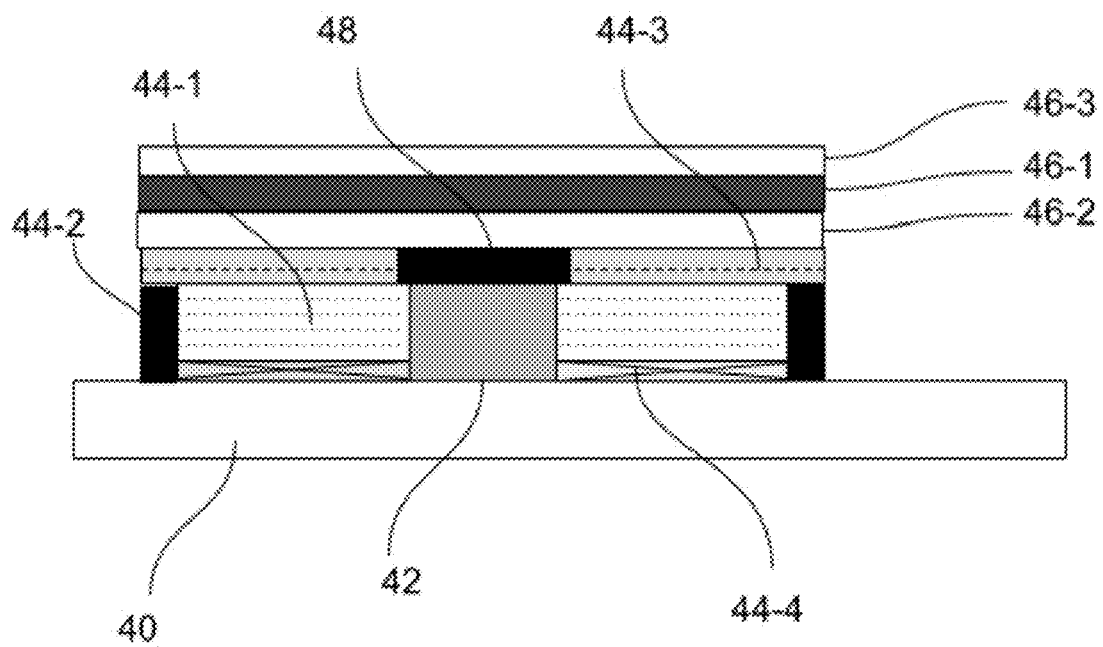
FIG. 4A illustrates a light guide structure to distribute the lights across a pixel.
Figure 4B:
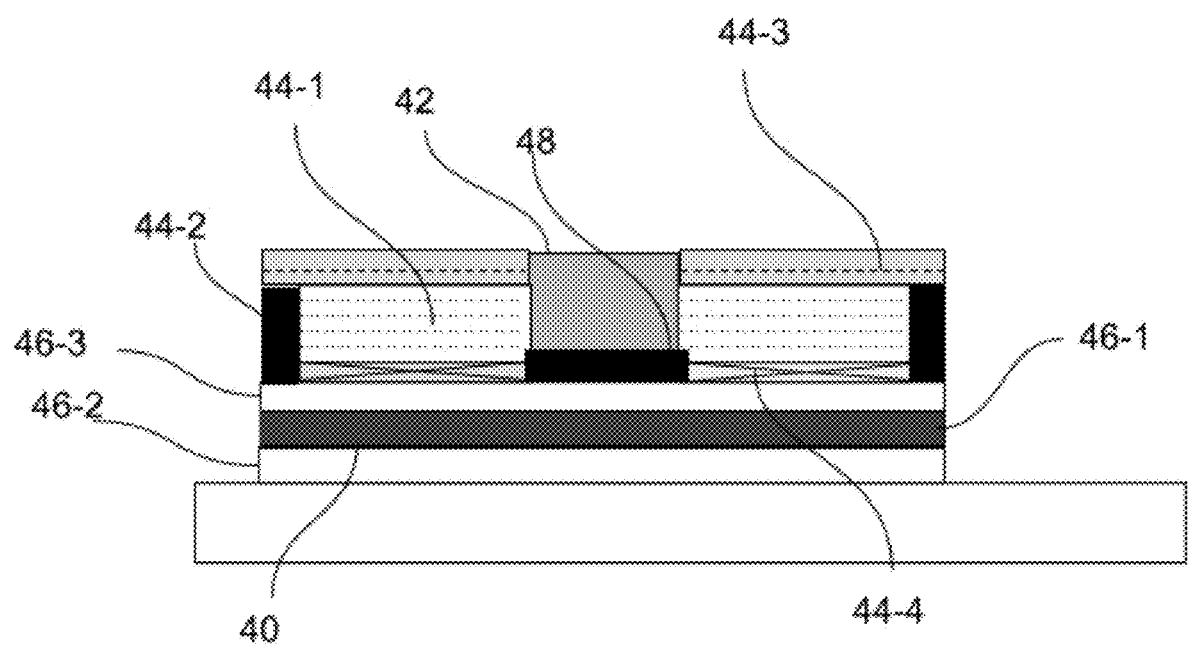
FIG. 4B illustrates another light guide structure to distribute the lights across a pixel.

There are several ways to implement the attenuator structure 38 and/or the light distribution structure 34. FIGS. 4A and 4B illustrate embodiments in which the light is guided to the sides from a light source 42 and either a top layer 44-3 (FIG. 4A) or bottom layer 44-4 (FIG. 4B) of a light distribution structure 44-1 enables the light to pass through. A reflector (or a blocking layer) 44-2 extending along the sides of the light distribution structure 44-1 is used to reflect the light back through the light distribution structure 44-1. The reflector 44-2 may be at an acute angle to the substrate 40 to reflect the light out through the top layer 44-3 or bottom layer 44-4 of the light distribution structure 44-1. The light passes through the top layer 44-3 (FIG. 4A) or the bottom layer 44-4 (FIG. 4B) and then passes through the light conversion layer 46-1. An attenuator structure 48 mounted on or over the light source 42 is used to reduce hot spots caused by direct line of sight transmission of light from the light source 42. The attenuator structure 48 may also comprise a connection electrode for the light source 42.

There can be layers before 46-2 and after 46-3 the light conversion layer 46-1. These layers can have different functionalities. FIG. 4B illustrates an alternate embodiment, in which the light source 42 directs the light through the substrate 40, which is transparent to wavelengths in the light, whereby the light conversion layer 46-1 may be mounted directly on or over the substrate 40, with the light distribution layer 44-1 and/or the attenuator 48 mounted between the light conversion layer 46-1 and the light source 42.

Figure 9:
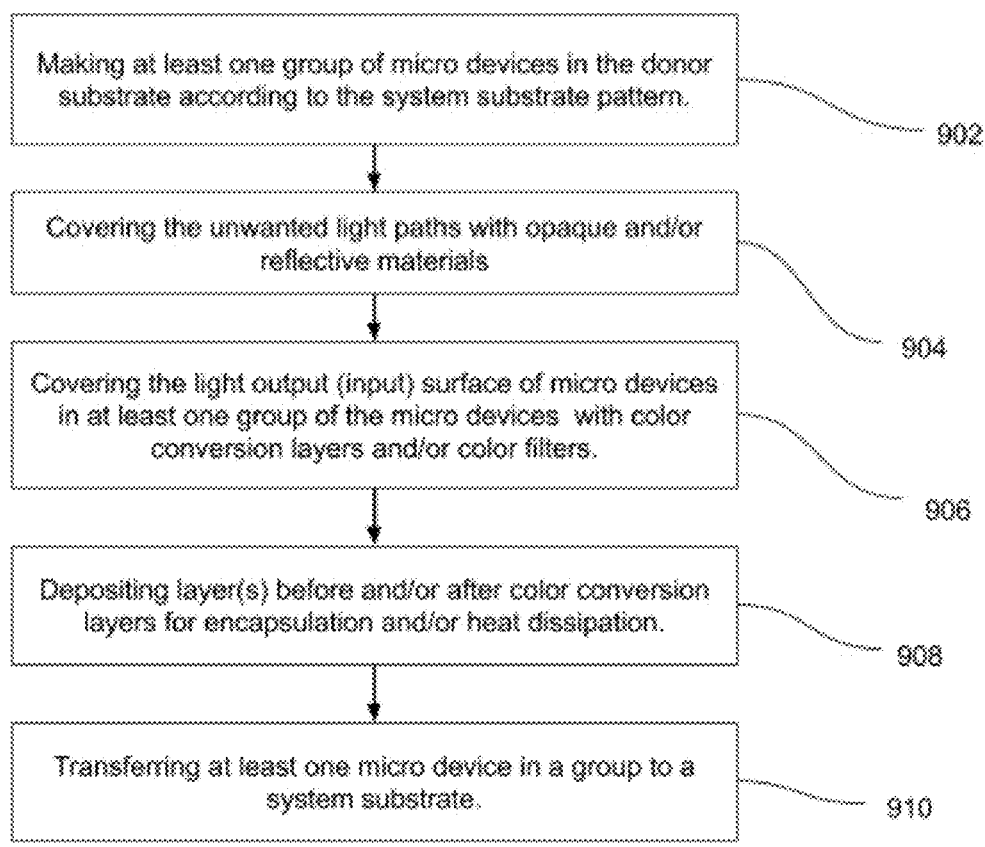
FIG. 9 illustrates a flow diagram for an alternative method in accordance with an embodiment of the present invention.

With reference to FIG. 9, the method to manufacture the pixel circuit comprises: step 902, making at least one group of micro devices 42 on a donor substrate 40 according to a system substrate pattern; step 904, covering or blocking undesired light paths from the micro devices 42 with opaque or reflective materials (e.g., light attenuator 48); step 906, covering the light output (input) surface of the micro devices 42 with the color conversion layers 46-1 and/or color filters; step 908, depositing layers 46-2 and 46-3 before and/or after the color conversion layers 46-1 for encapsulation and/or heat dissipation; and step 910, transferring at least one of the micro devices 42 in a group to a system substrate.

Figure 5A:
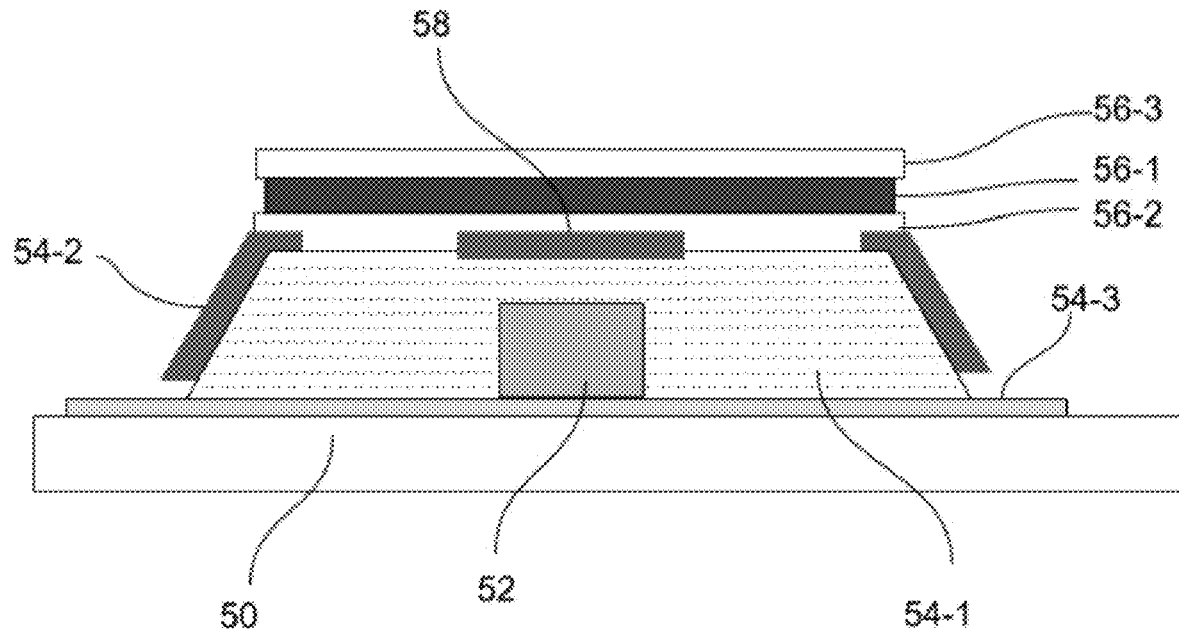
FIG. 5A illustrates a light guide structure with an attenuator to reduce the effect of hotspots on the color conversion layer.
Figure 5B:
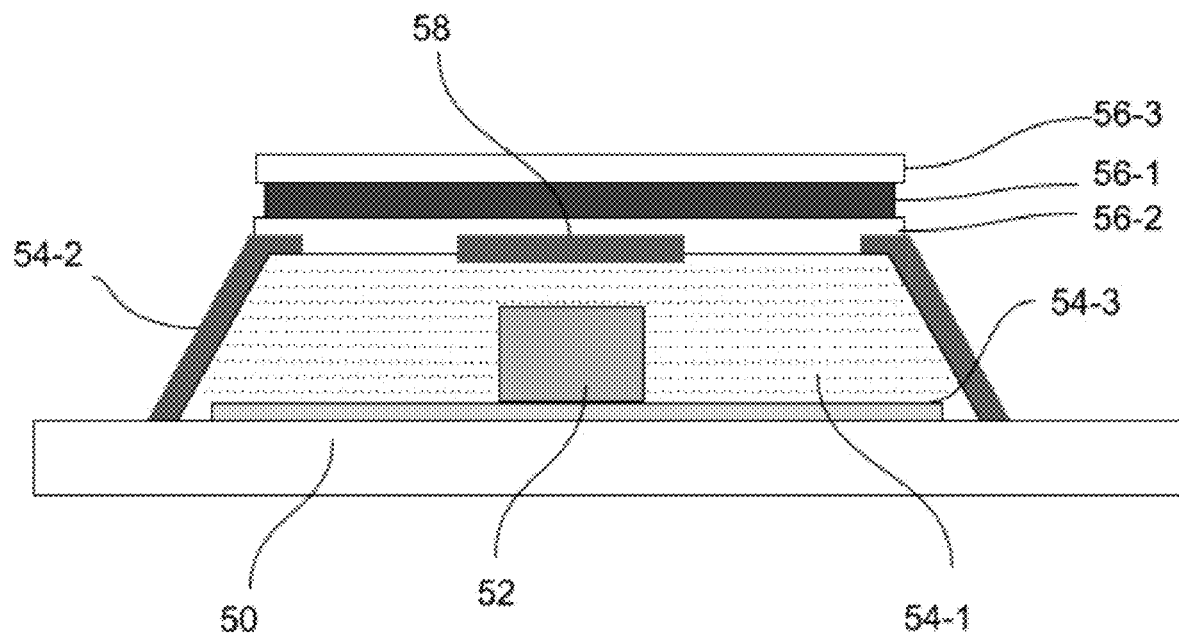
FIG. 5B illustrates another light guide structure with an attenuator to reduce the effect of hotspots on the color conversion layer.

Another configuration for a light distribution and a light attenuator structure is demonstrated in FIGS. 5A to 5F. In FIGS. 5A and 5B, a subpixel 51 includes a base reflector layer 54-3 mounted on a substrate 50 with a light source 52 mounted thereon. A light distribution layer 54-1 is disposed over the light source 52 and the base reflector layer 54-3. The light distribution layer 54-1 includes sides formed (e.g., etched) at an acute angle (e.g., 30°-60°), ideally 40°-50°, to the substrate 50 to form a frusto-pyramidal or frusto-conical shape. The angled sides of the light distribution layer 54-1 are then covered (e.g., coated) with angled side reflectors 54-2 at the same angle to the substrate 50. An attenuator 58 is mounted on or over the light source 52 to prevent a direct line of sight from the light source 52 to a light conversion layer 56-1 disposed over the light distribution layer 54-1. Additional layers 56-2 and 56-3 may also be provided. The base reflector 54-3 and the angled side reflectors 54-2 redirect the light from the light source 52, perhaps multiple times, back through the light conversion layer 56-1 and then finally out through the light conversion layer 56-1. The attenuator layer 58 may also act as a reflecting layer and reflect the light from the light source 52 toward the base reflector 54-3. The combination of reflectors 54-3, 54-2, and 58 reduces the hot spot problem (i.e., the high light intensity at a direct line of sight from the light source 52 to the light conversion layer 56-1) and distributes the light across the pixel 51. FIG. 5B illustrates an embodiment in which the light distribution layer 54-1 is mounted (e.g., coated) over the entire base reflector 54-3 with the angled side reflectors 54-2 extending down to the substrate 50, in contrast to FIG. 5B, in which the base reflector 54-3 extends the entire width of the pixel 51, whereby the angled side reflectors 54-2 extend proximate to the base reflector 54-3.

Figure 5C:
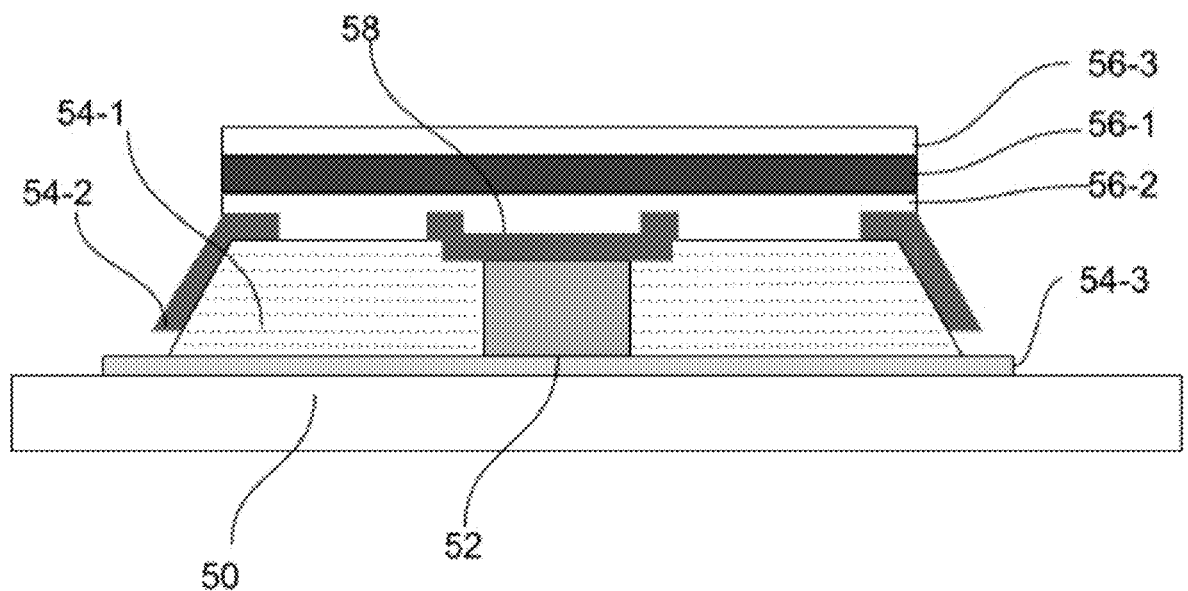
FIG. 5C illustrates another light guide structure with an attenuator to reduce the effect of hotspots on the color conversion layer.
Figure 5D:
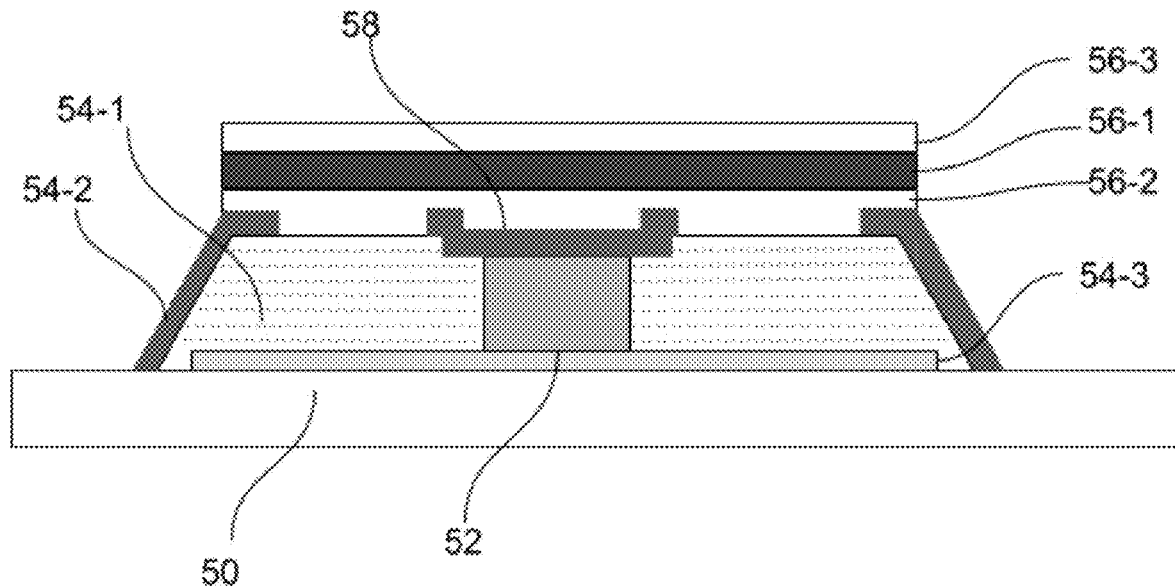
FIG. 5D illustrates another light guide structure with an attenuator to reduce the effect of hotspots on the color conversion layer.

FIGS. 5C and 5D are substantially identical to FIGS. 5A and 5B, except that the attenuator 58 is mounted directly on the light source 52, and acts as a contact layer therefor. The contact 58 may be electrical or just mechanical. The contact 58 may be connected to some other structure (e.g., electrical traces or mechanical structure) through a via. The contact 58 may also be connected to the angled side reflectors 54-2 through a patterned trace or through a common electrode. The contact 58 may also be connected to a common electrode. In this case, the common electrode can be deposited on top of the attenuator 58 after a possible dielectric layer with an opening at the attenuator 58. The common electrode may be either patterned into rows or columns or a single layer that connects an array of the pixels 51C or 51D in the display. The base reflector layer 54-3 may be extended beyond the angled side reflector layer 54-2, as hereinbefore discussed. In the case where the base reflector layer 54-3 is not extended beyond the angled side layer 54-2, the angled side layer 54-2 may cover the whole pixel structure 51, as demonstrated in FIGS. 5B and 5D.

Figure 10A:
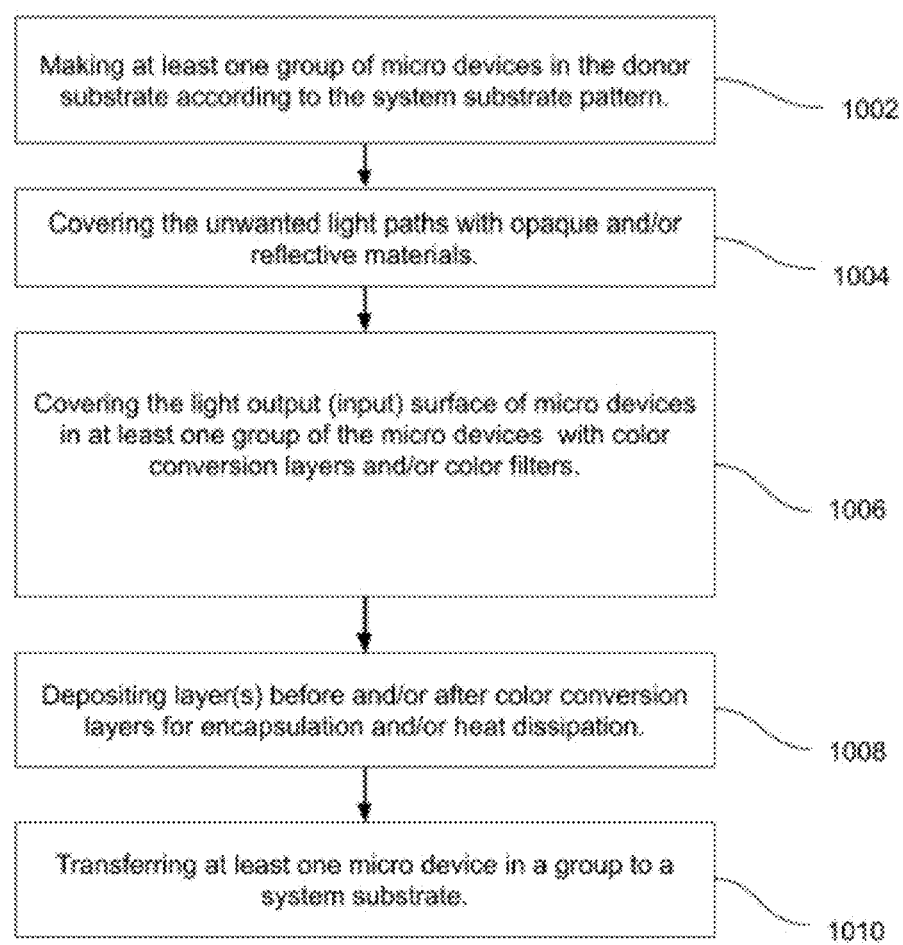
FIG. 10A illustrates a flow diagram for alternative methods in accordance with embodiments of the present invention.

With reference to FIG. 10A, the method to manufacture the pixel circuit comprises: step 1002, making at least one group of micro devices 52 on a donor substrate 50 according to a system substrate pattern; step 1004, covering or blocking undesired light paths from the micro devices 52 with opaque or reflective materials (e.g., light attenuator 58); step 1006, covering the light output (input) surface of the micro devices 52 with the color conversion layers 56-1 and/or color filters, wherein the color conversion layers may include a dielectric layer for passivation; step 1008, depositing layers 56-2 and 56-3 before and/or after the color conversion layers 56-1 for encapsulation and/or heat dissipation; and step 1010, transferring at least one of the micro devices 52 in a group to a system substrate.

Figure 5E:
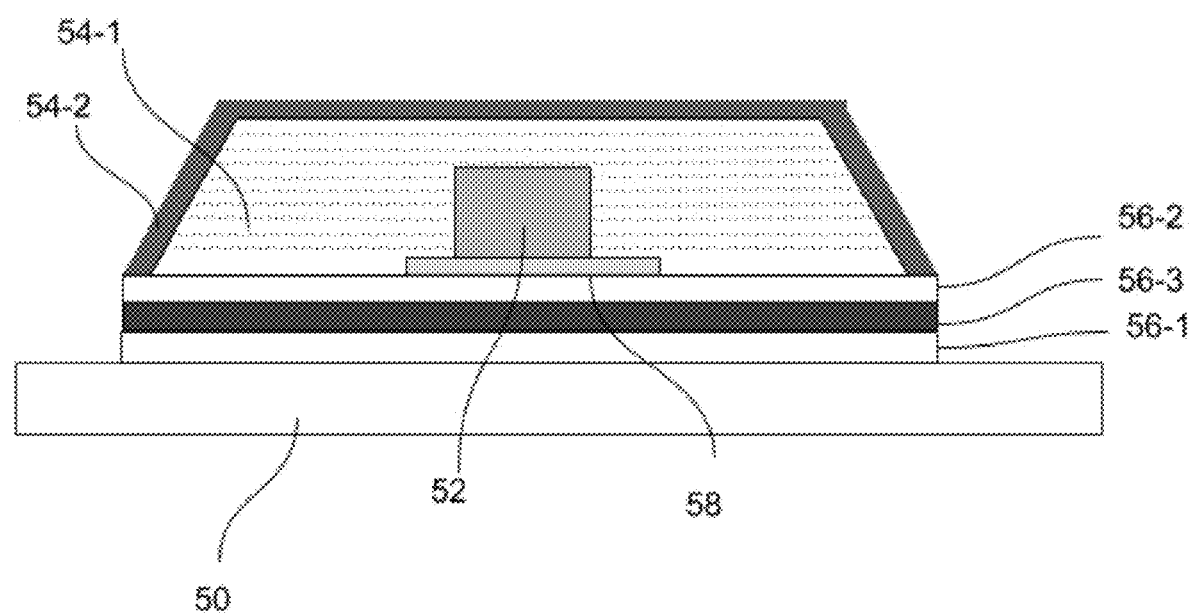
FIG. 5E illustrates another light guide structure with an attenuator to reduce the effect of hotspots on the color conversion layer.
Figure 5F:
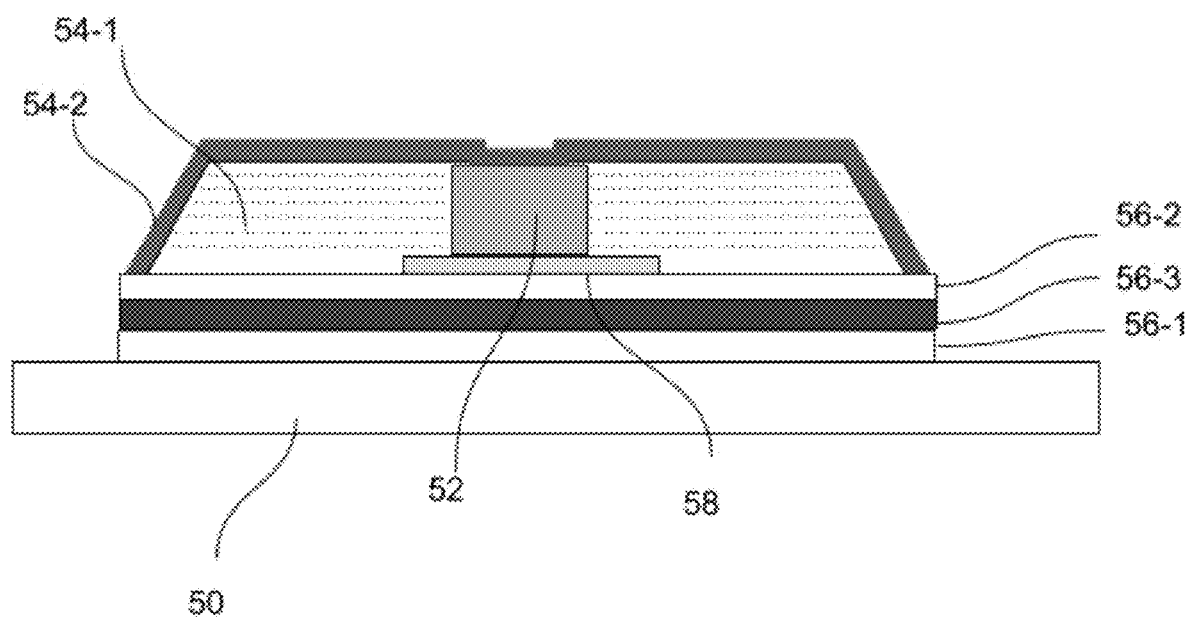
FIG. 5F illustrates another light guide structure with an attenuator to reduce the effect of hotspots on the color conversion layer.

In the embodiment illustrated in FIGS. 5E and 5F, the light distribution layer 54-1 is substantially the same as in FIGS. 5A to 5D, but the light conversion layer 56-1 is mounted (e.g., coated) proximate to the substrate 50, whereby the light is directed from the light source 52 through the substrate 50, which is transparent to wavelengths in the light. The attenuator 58 is positioned on or above the light conversion layer 56-1 between the light source 52 and the light conversion layer 56-1. A cover reflector 54-4 (e.g., a reflective coating) is disposed over the entire light distribution layer 54-1, including the angled sides, to reflect the light back toward and through the color conversion layer 56-1, and the substrate 50. There may be layers before 56-2 and after 56-3 the light conversion layer 56-1. In FIG. 5F, at least a portion of the cover reflector 54-4 may contact the light source 52 directly, and act as a contact for the light source 52.

Figure 10B:
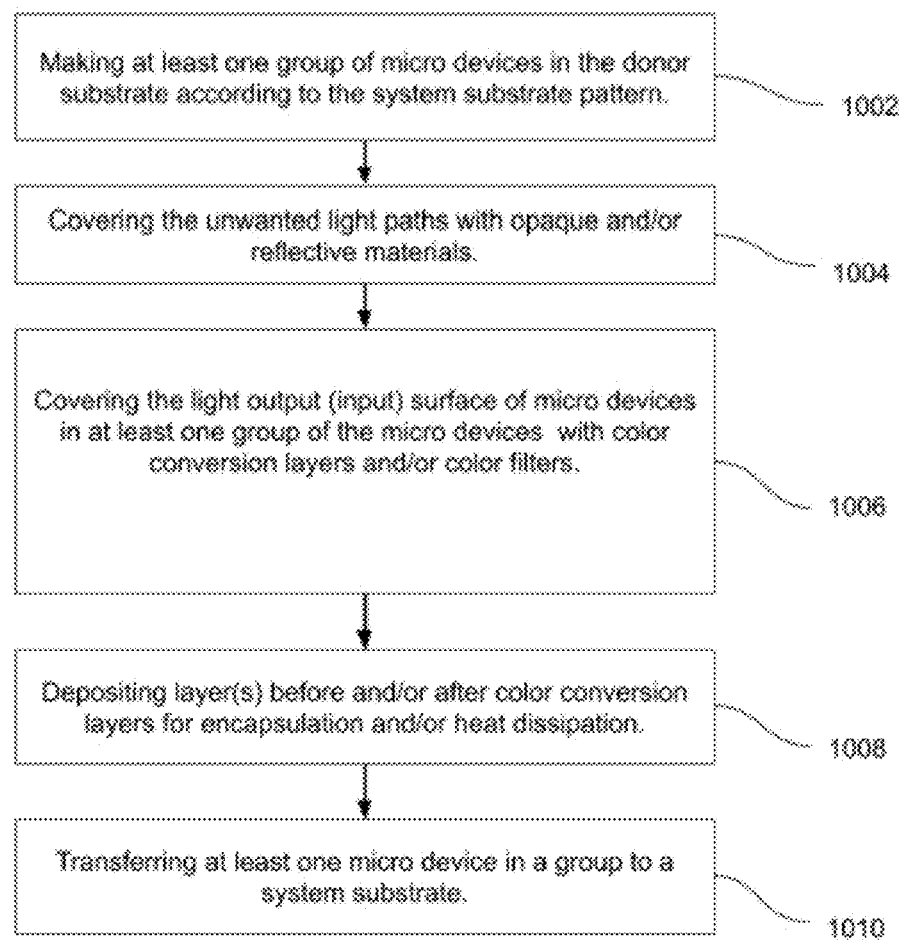
FIG. 10B illustrates a flow diagram for alternative methods in accordance with embodiments of the present invention.

With reference to FIG. 10B, the method to manufacture the pixel circuit comprises: step 1002, making at least one group of micro devices 52 on a donor substrate 50 according to a system substrate pattern; step 1004, covering or blocking undesired light paths from the micro devices 52 with opaque or reflective materials (e.g., light attenuator 58); step 1006, covering the light output (input) surface of the micro devices 52 with the color conversion layers 56-1 and/or color filters, wherein one of the color conversion layers or the light attenuator 58 may include a conductive layer acting as an electrode for the micro device 52; step 1008, depositing layers 56-2 and 56-3 before and/or after the color conversion layers 56-1 for encapsulation and/or heat dissipation; and step 1010, transferring at least one of the micro devices 52 in a group to a system substrate.

Figure 6A:
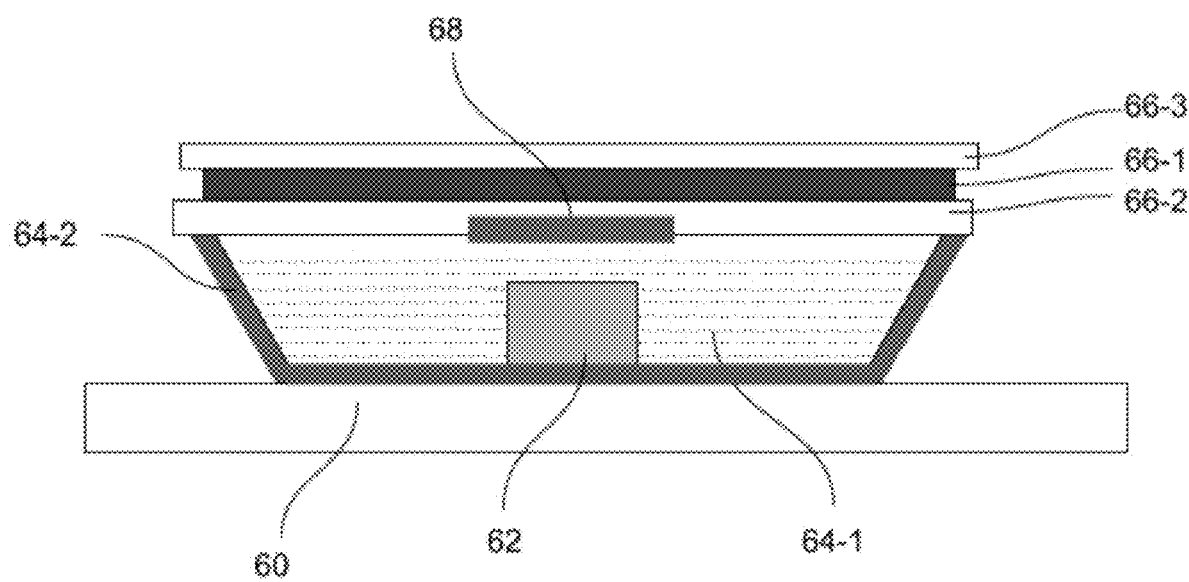
FIG. 6A illustrates another light guide structure with an attenuator to reduce the effect of hotspots on the color conversion layer.
Figure 6B:
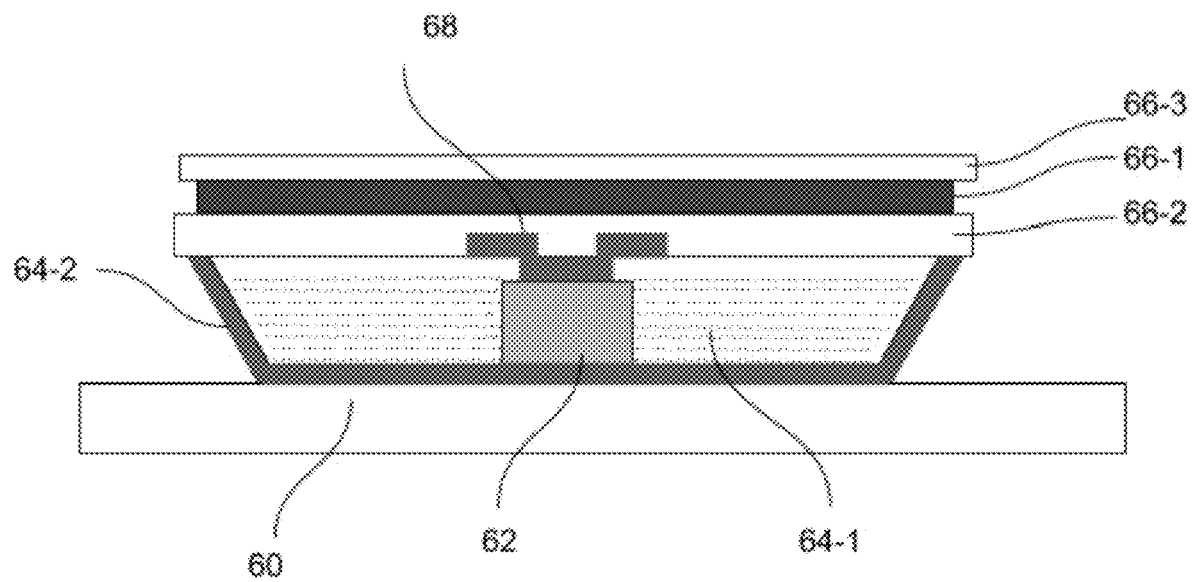
FIG. 6B illustrates another light guide structure with an attenuator to reduce the effect of hotspots on the color conversion layer.

FIGS. 6A and 6B illustrate another embodiment of a subpixel structure 61 that includes a light distribution structure 64 with diverging sides in the direction of light transmission formed at an obtuse internal angle to a substrate 60 (acute external angle). A base reflector layer 64-2, provided on the bottom and angled side surfaces of the light distribution layer 64, also at the same angle as the sides of the light distribution structure 64, reflects the light from a light source 62 away from the substrate 60 and up through a light conversion layer 66-1. A light attenuator 68 mounted over the light source 62 (e.g., on a top surface of the light distribution layer 64) eliminates hot spot effects on the light conversion layer 66-1. The embodiment illustrated in FIG.

6B is substantially the same as the one in FIG. 6A, except that the light attenuator structure 68 extends into contact with the light source 62, and thereby may act as a contact for the light source 62 to an external source of electricity.

In all the structures, the conversion layer 66-1 may be deposited over a bank structure 66-2, in which a generally organic or dielectric layer is deposited. The bank structure layer 66-2 may be patterned to open the layer in the area where light conversion layer 66-1 will be deposited.

Figure 11:
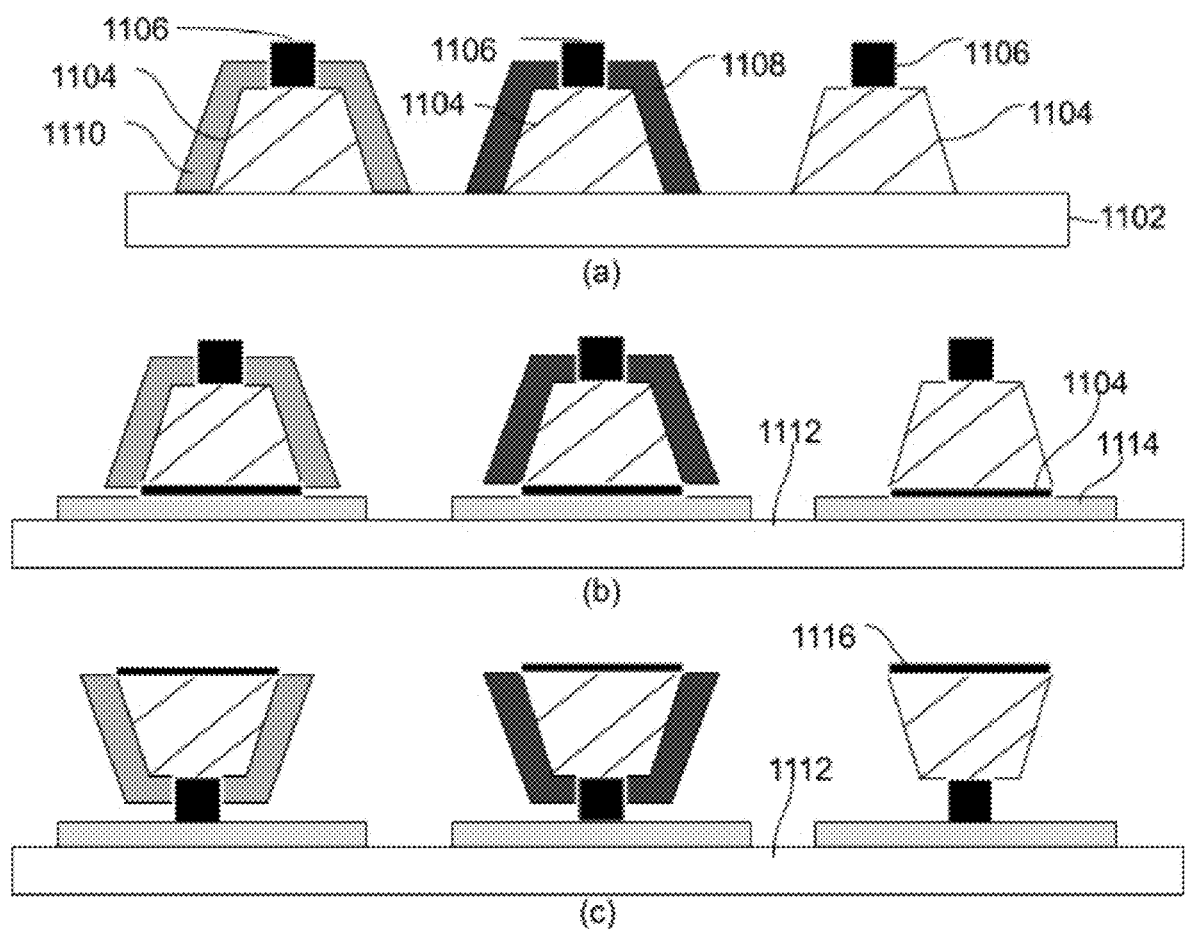
FIG. 11 illustrates various embodiments of the present invention.

With reference to FIGS. 11a to 11c, the transfer process is illustrated, in which a donor substrate 1102 initially includes three micro devices 1104. Each of the micro devices 1104 includes an electrode 1106, which may be transparent, but ideally comprises an opaque or reflective material providing a light attenuator function. The middle micro device 1104 includes (e.g., is coated with) a first color conversion or filter layer 1108 to convert the emitted light from the micro device 1104 into a different color. The left micro device 1104 includes (e.g., is coated with) a second color conversion or filter layer 1110 to convert the light emitting from the micro device 1104 into a third color. Together, the three micro devices 1104 may comprise the three different colors (i.e., red, green, and blue) required to form a pixel for a display device.

In a first embodiment, the three micro devices 1104 are transferred to a cartridge substrate and provided with a second electrode 1116 mounted on the opposite end of the micro device 1104 as the electrode 1106. The second electrode 1116 may be comprised of an opaque or reflective material to redirect any light from the micro device 1104 back through any light distribution material, around any light attenuator structure, and through any color conversion layer 1108 or 1110. Each of the micro devices 1104 are then mounted on pads 1114 on a receiver substrate 1112 (FIG. 11b), with the second electrode 1116 in electrical contact with the pad 1114.

Alternatively, as illustrated in FIG. 11c, the three micro devices 1104 may be directly transferred to the receiver substrate 1112 with the electrode 1106 in contact with the pads 1114. In this embodiment, the receiver substrate 1112 and the pads 1114 may be transparent to the light emitted from the micro devices 1104 and any subsequent conversion.

Encapsulating Functional Tuning Materials

One method to improve system performance is to integrate different micro devices into a system substrate. The challenge is that different micro devices can have different performance and also use different material systems. The embodiments described below are related to creating different functional micro devices (e.g., red, green, blue LED, or a sensor from a single blue LED) by integrating functional tuning materials (e.g., a color conversion layer). As functional tuning materials are in general sensitive to environmental agents (e.g., oxygen or water), encapsulation.

Figure 12A:
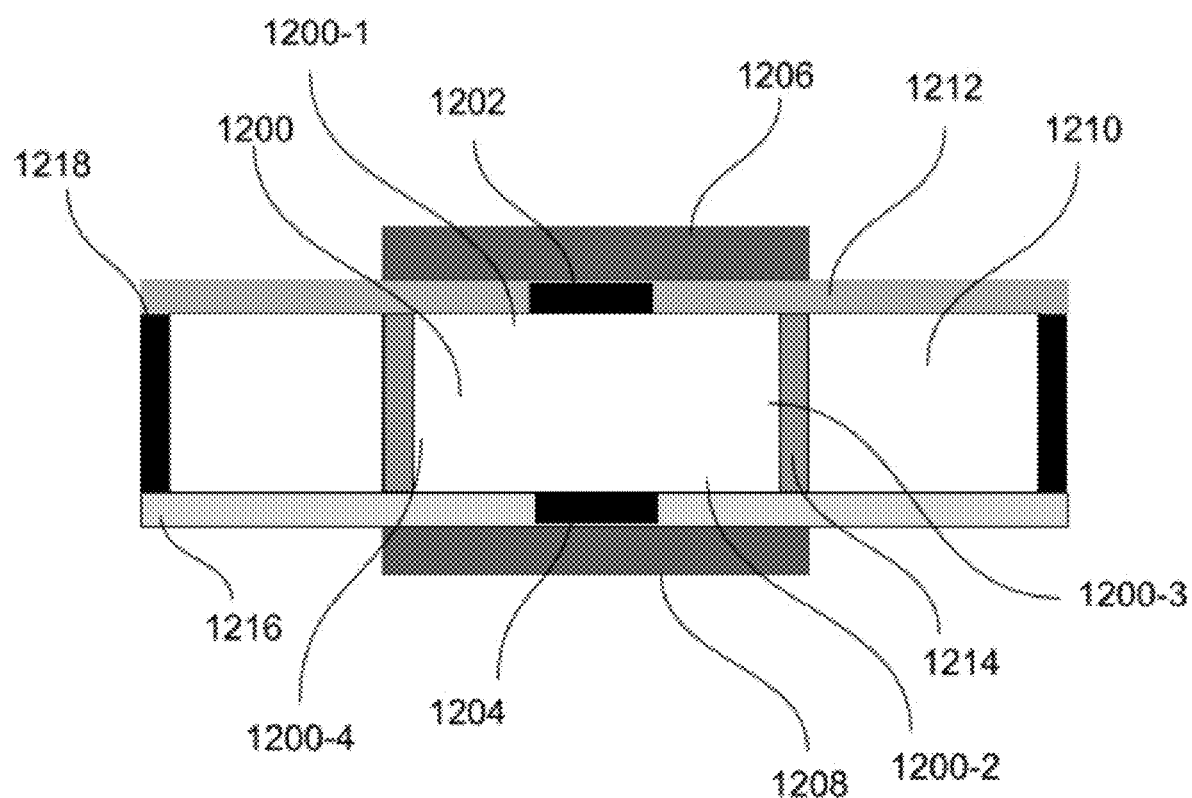
FIG. 12A illustrates a cross-sectional view of the integration of a micro device with a color conversion layer in accordance with an embodiment.

FIG. 12A shows a micro device 1200 embedded in functional tuning/alteration/modifying materials 1210. The functional tuning/alternation materials are referred to as color conversion layers as an example in the rest of the description. In addition, the embodiment exemplarily illustrated one micro device 1200, but the invention is not limited thereto. The number of micro devices 1200 may be changed.

Here, a plurality of semiconductor layers is formed/transferred into a substrate forming a top surface 1200-1 and a bottom surface 1200-2. The plurality of the semiconductor layers are isolated in different areas forming microdevices (a micro device 1200 is shown as an example) with at least one side surface 1200-3 (or 1200-4). Here, the micro device 1200 can have at least one contact (via) 1202, 1204 on one side of the device (or just on one side). The contacts 1202, 1204 connect the device 1200 to pads 1206 and 1208. The micro device 1200 may have a stack of different layers such as active layers sandwiched between charge blocking layers and doping layers. A space formed around the micro device 1200 created by at least one cover layer which is optically coupled to the at least one side surface 1200-3 (or 1200-4). There is a housing structure formed around the device consisting of cover walls 1212, 1214, 1216, and 1218. The top and bottom cover walls (layers) 1212 and 1214 extend beyond the top and bottom surface of the micro device 1200. The functional tuning materials (e.g. color conversion materials) 1210 are inside the housing structure. The cover walls 1212, 1214, 1216, and 1218 can be encapsulation layers to protect the color conversion materials from oxygen and moisture. The color conversion materials can be phosphor or quantum dots. In addition, the cover walls can include optical enhancement layers with some optical property to enhance the light coupling into the color conversion materials. In one case, the cover wall 1212 or 1216 can be reflective layers to reflect the light into the color conversion materials. In another case, the cover wall 1212 or 1216 are designed to only reflect small wavelengths (e.g., smaller than 450 nm) while allowing longer wavelength to go through. This allows the converted light to pass through the wall. In another case, the wall 1214 enhances the light extraction from the micro device 1200 into color conversion material 1210. In one example, the wall 1218 is reflective to reflect back the lights. In another case, the wall 1218 is transparent to allow at least some wavelength to pass through.

Figure 12B:
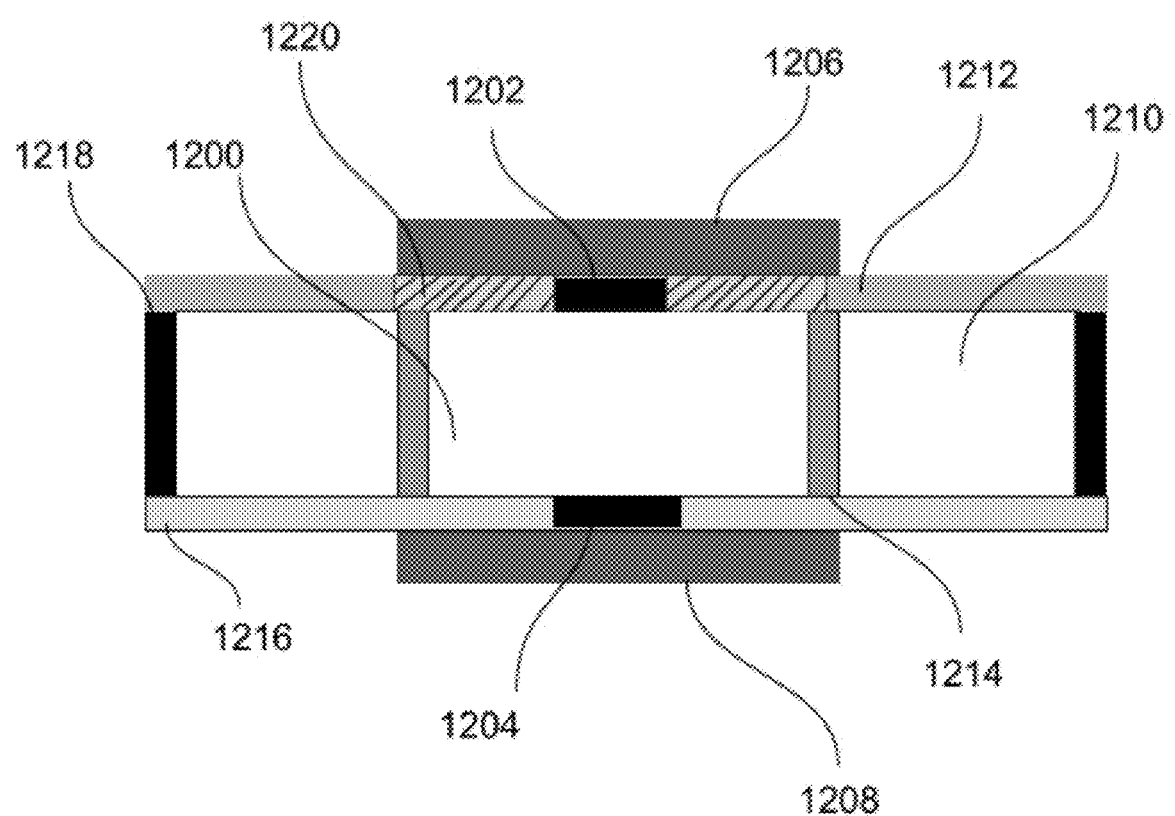
FIG. 12B illustrates a cross-sectional view of the integration of a micro device with a color conversion layer in accordance with an embodiment.

With reference to FIG. 12B, the cover wall 1212 or 1216 can have two parts: a reflective part 1220 and a transparent part. The reflective layer 1220 is extended on top (or can be extended to the bottom) side of the device 1200. In one case, the transparent part can also be transparent only to a portion of the wavelength to block the micro device light that goes out directly without being converted.

Figure 12C:
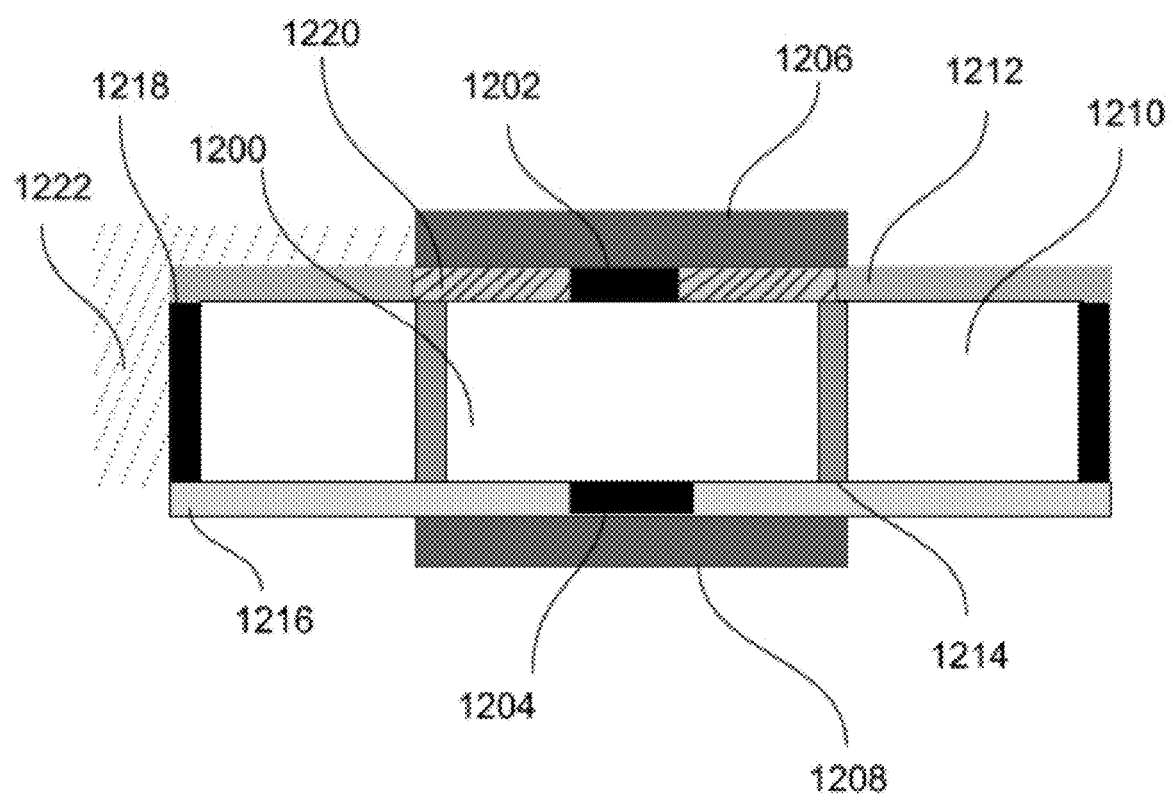
FIG. 12C illustrates a cross-sectional view of the integration of a micro device with a color conversion layer in accordance with an embodiment.

In another case shown in FIG. 12C, color filter layers 1222 can be deposited on at least one of the walls to further prevent some of the wavelength from leaving the structure/device 1200 or enter the color conversion material 1210 from the outside.

Figure 13A:
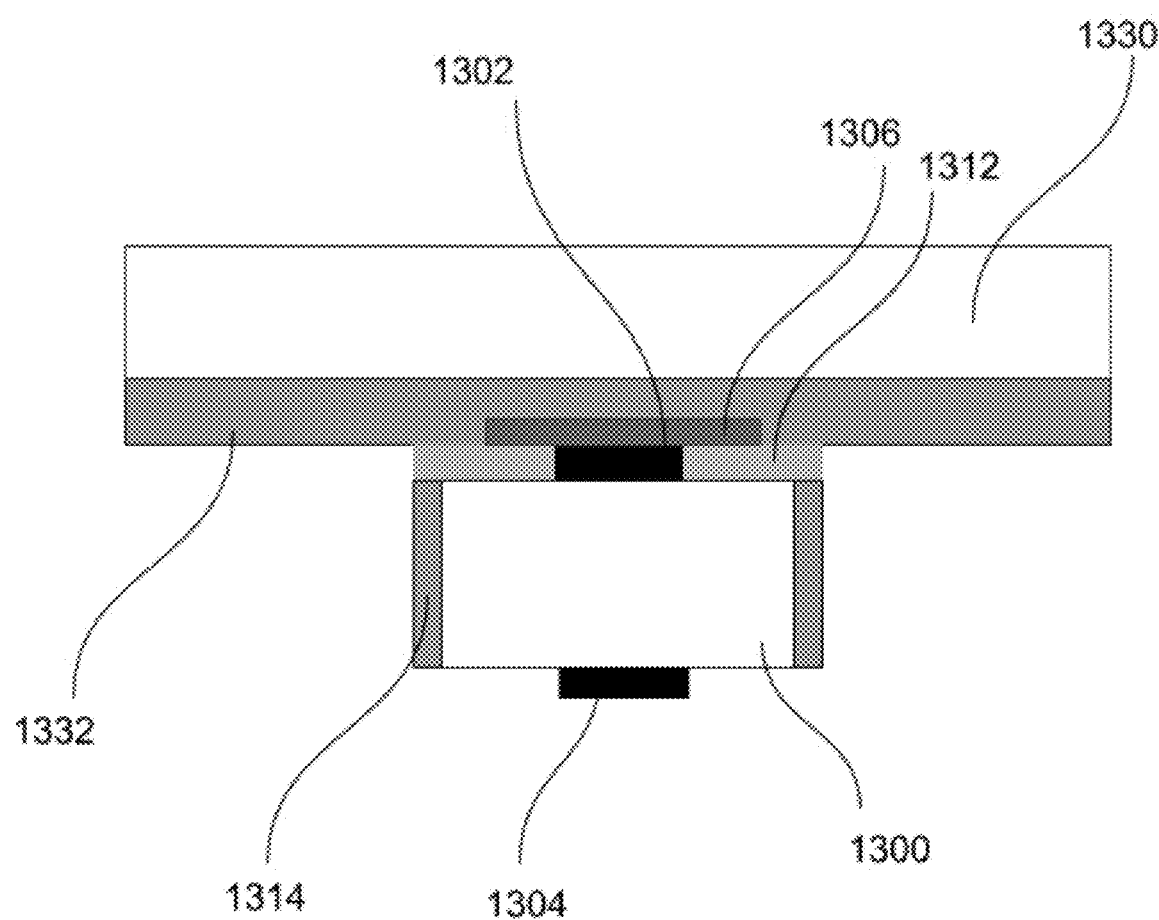
FIG. 13A illustrates a cross-sectional view of the integration of micro devices with color conversion layers and contacts in accordance with an embodiment.

FIG. 13A shows a cross-sectional view of a micro device 1300 with contacts 1302 and 1304 on either the top or bottom side of the micro device. A pad 1306 can couple to the device 1300 through at least one of the contacts (e.g., the contact 1302 at the top side). In one case, a layer 1312 that can be a dielectric layer covers the part of the device surface that is not covered by the contact 1302. There can be sidewall layers 1314 around the micro device which may have different functions such as a passivation layer, optical enhancement layer, or encapsulation layer. Here, a buffer layer or sacrificial layers 1332 may be provided between the micro device 1300 and a substrate 1330.

Figure 13B:
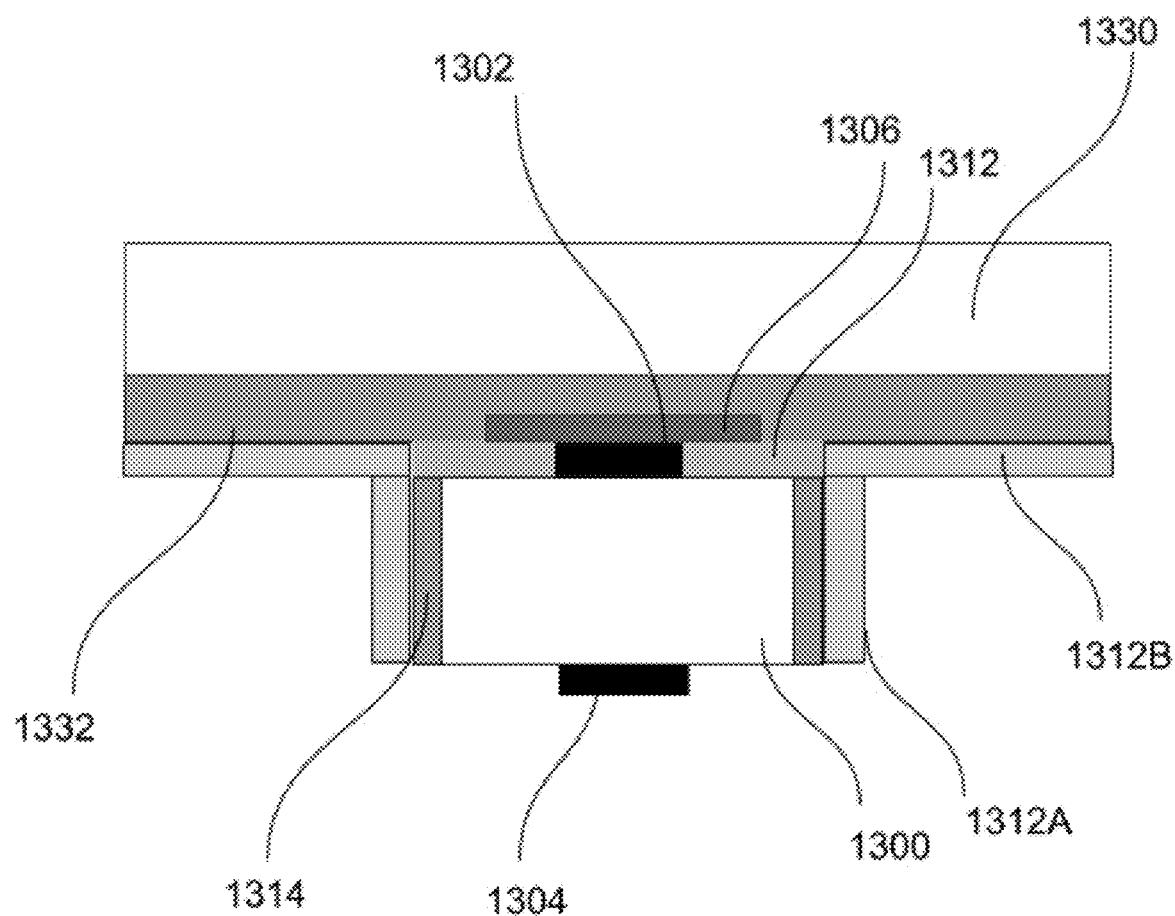
FIG. 13B illustrates a cross-sectional view of the integration of micro devices with color conversion layers and encapsulation walls in accordance with an embodiment.

FIG. 13B shows a cross-sectional view where encapsulation walls 1312A and 1312B are formed around the micro device 1300. The encapsulation layer 1312A can be the same as sidewall layers 1314. These sidewall layers 1314 can be deposited by different means such as printing, evaporation, sputtering or more. The sidewall layers can be patterned by traditional photolithography, liftoff, or printing.

Figure 13C:
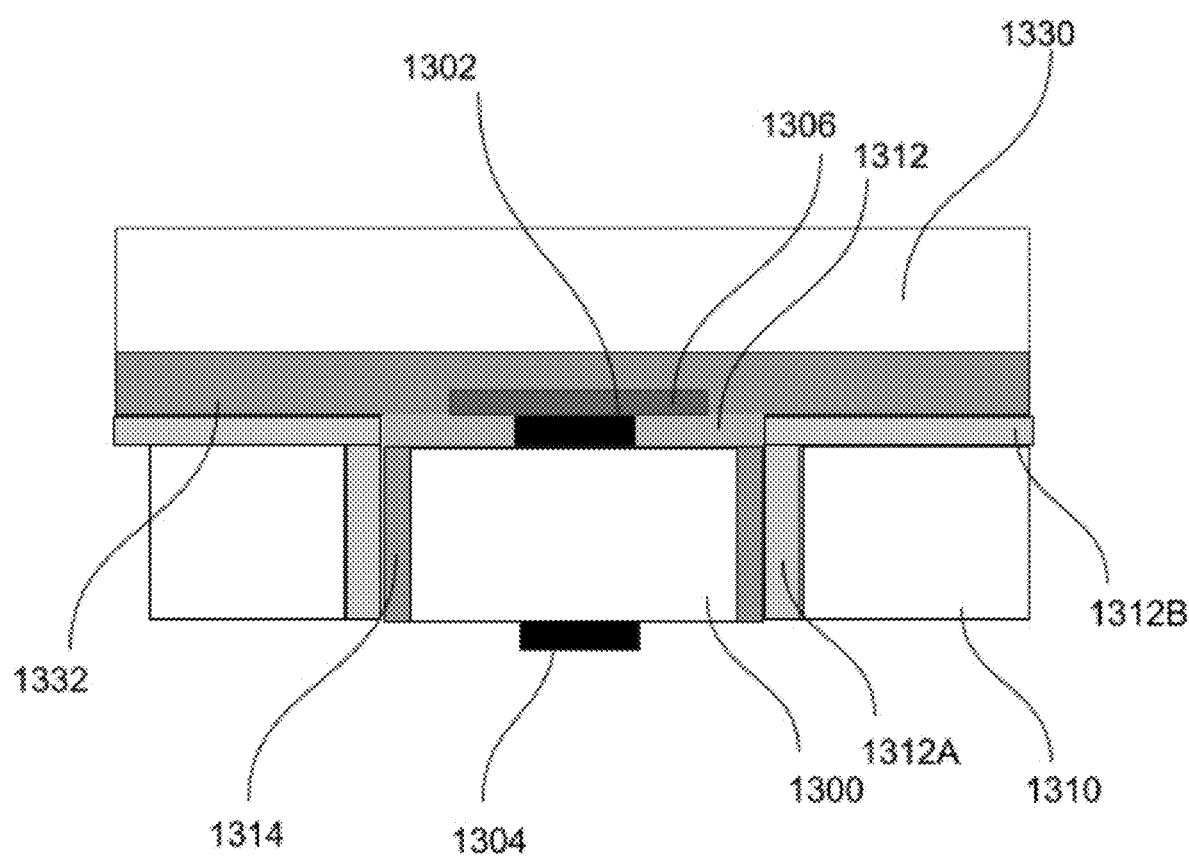
FIG. 13C illustrates a cross-sectional view of the integration of micro devices with color conversion layers in accordance with an embodiment.

FIG. 13C shows a cross-sectional view of the color conversion materials are formed on top of the encapsulation walls 1312A and 1312B. The color conversion layers 1310 can cover the side of the device 1300 not facing the substrate 1330.

Figure 13D:
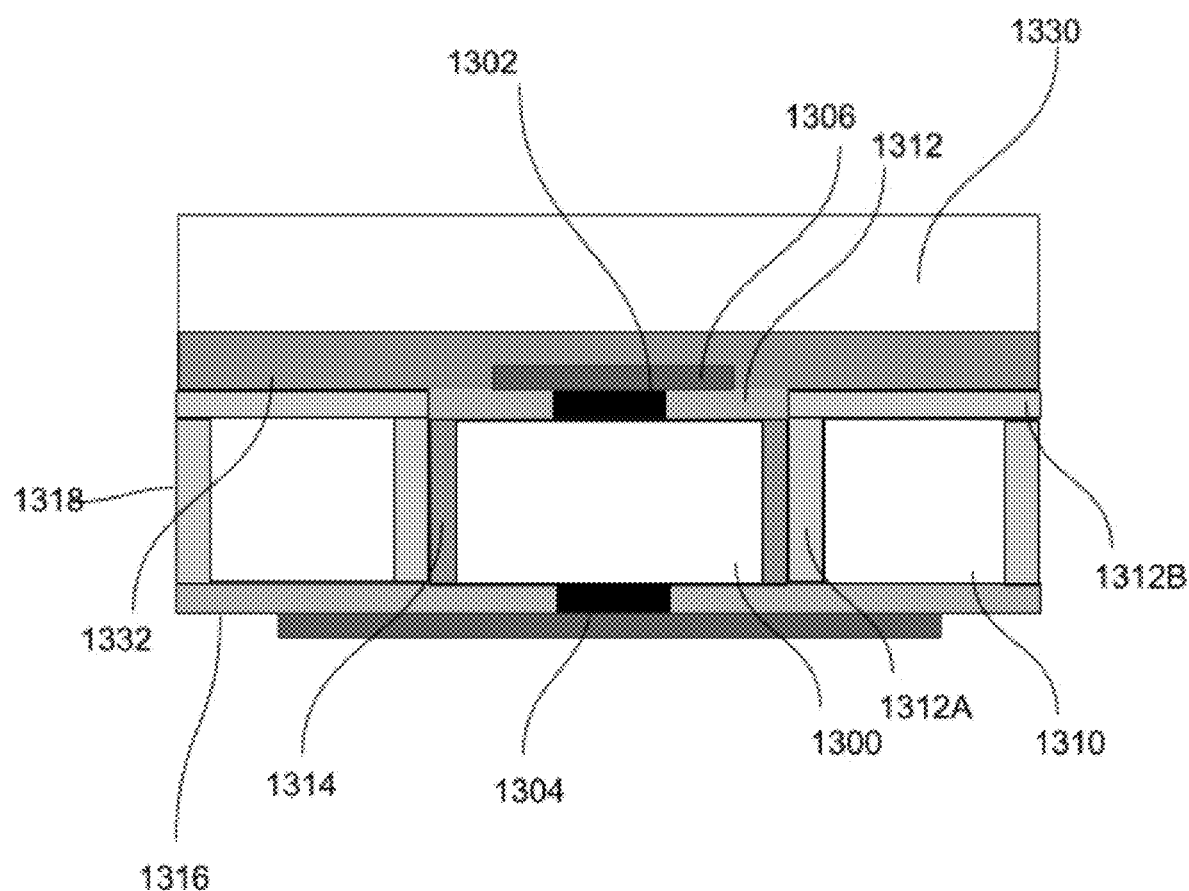
FIG. 13D illustrates a cross-sectional view of the integration of micro devices with color conversion layers in accordance with an embodiment.

FIG. 13D shows a cross-sectional view of the micro device structure where the cover walls 1316 and 1318 are formed to enclose the color conversion material between the cover walls 1318, 1312, and 1316.

Figure 13E:
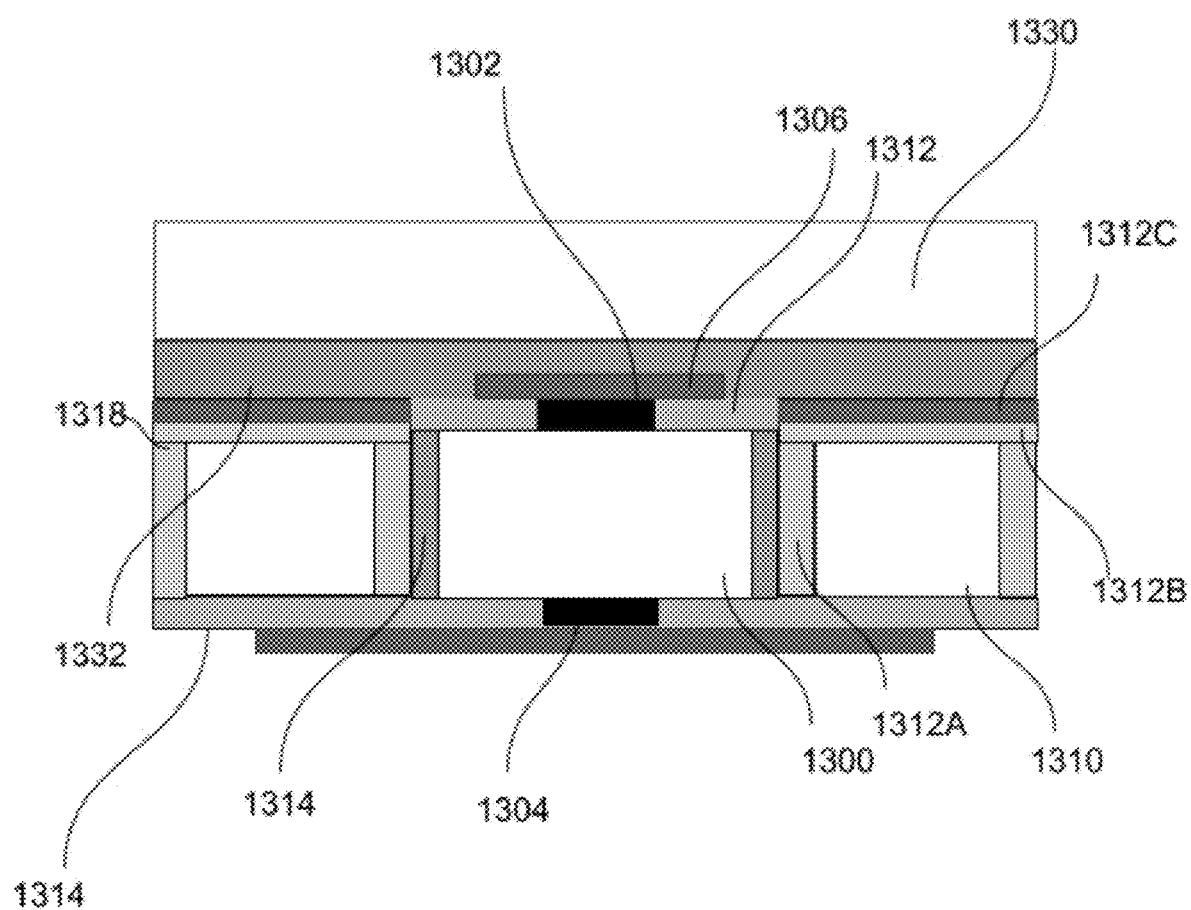
FIG. 13E illustrates another embodiment with encapsulation walls that have a stack of different layers with different functionalities in accordance with the present invention.

FIG. 13E shows another cross-sectional view wherein a plurality of other walls can also be mounted on the micro device. The plurality of other layers may have a stack of different layers with different functionalities. In one case, the walls can include a reflective (e.g., total or selective) layer 1312C and encapsulation layers 1312B.

Figure 13F:
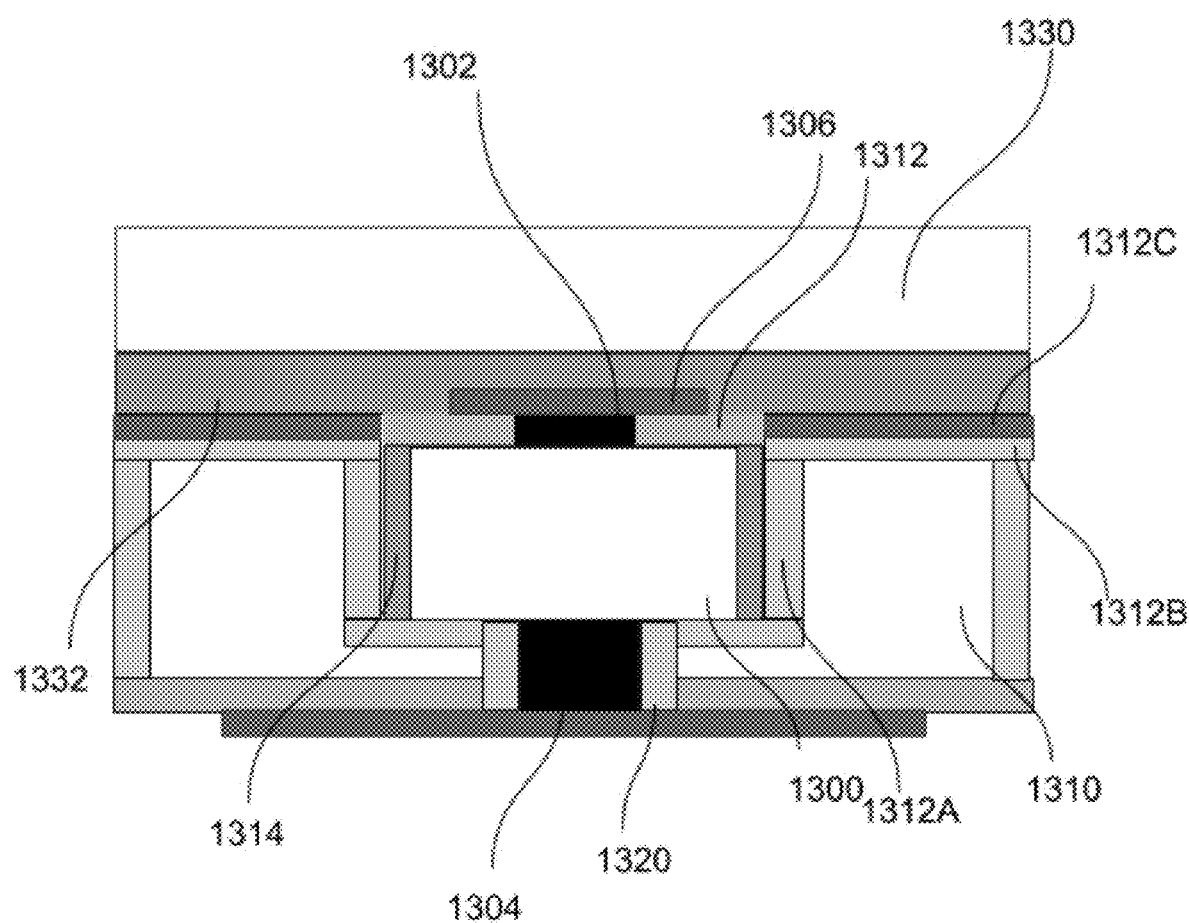
FIG. 13F illustrates another embodiment wherein a contact extends beyond the color conversion layer in accordance with the present invention.

In another embodiment, the color conversion layer can be on a top or bottom surface of the micro device 1300. In one example as shown in FIG. 13F, if there is a contact on the same surface, the contact 1304 height will be increased to extend beyond the color conversion layer on that surface. It is possible to add walls 1320 to cover the side of the contact 1304 and the said surface of the micro device 1300.

Figure 14A:
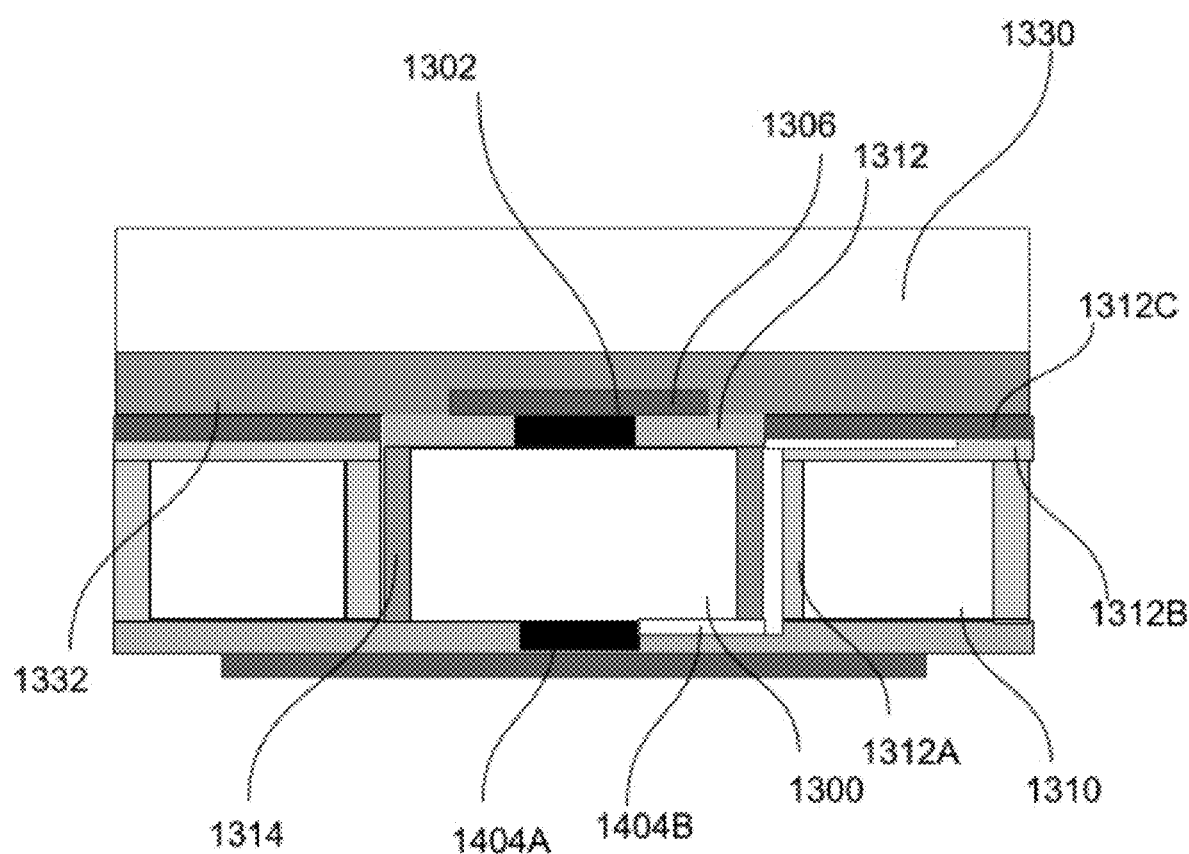
FIG. 14A illustrates a cross-sectional view of the integration of micro devices with color conversion layers in accordance with an embodiment.

FIG. 14A shows another embodiment wherein the contact 1404A on one of the surfaces may be connected to a contact 1302 area on the opposite side of the device 1300 through a trace 1404B. The trace can be separated from the device by a dielectric layer. The trace needs to be coupled with the color conversion layers, and transparent in some areas to allow the light to pass through it. In another case, the trace covers only part of the side of the micro device so that the light can pass through other areas. For better encapsulation, the wall layers 1312A and 1312B used for encapsulation are formed after the trace 1404B.

Figure 14B:
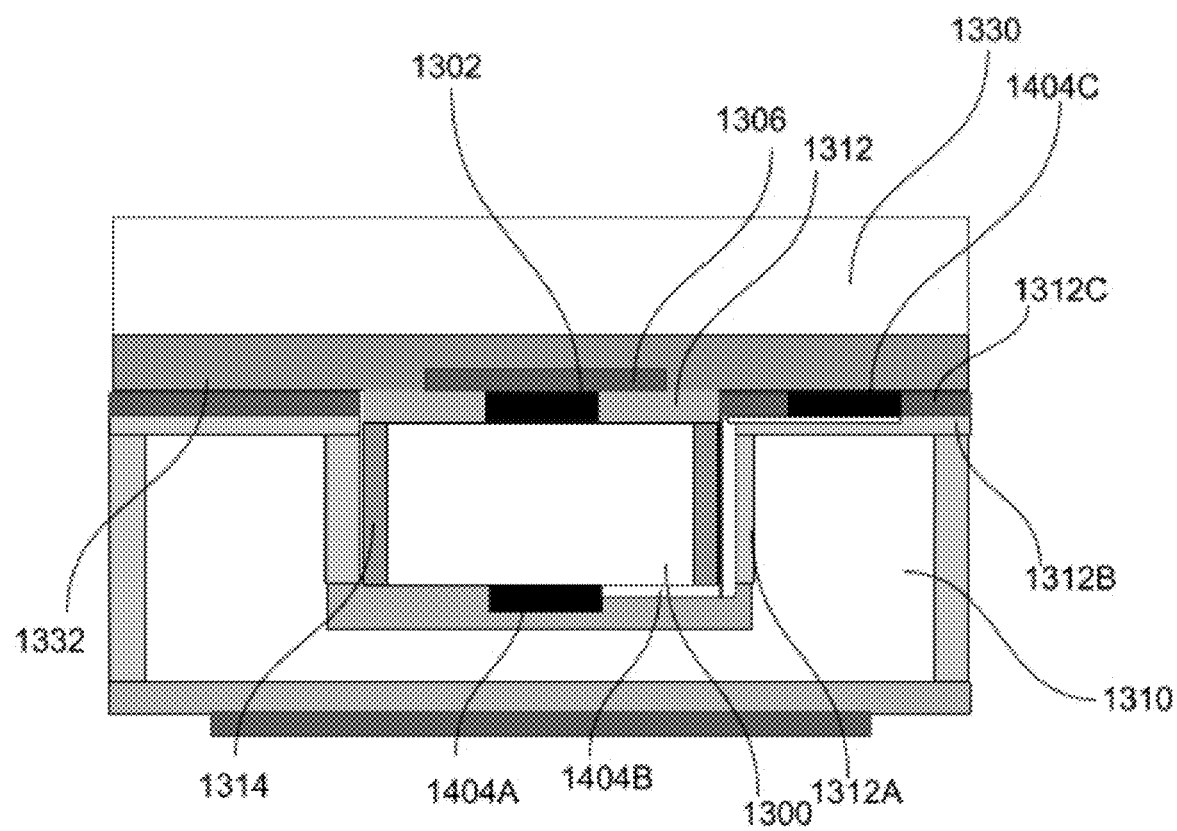
FIG. 14B illustrates a cross-sectional view of the integration of micro devices with color conversion layers in accordance with an embodiment.

In another embodiment, the color conversion layers can be on a top or bottom surface of the micro device 1300. In one example as shown in FIG. 14B, if there is a contact on the same surface, the contact 1404A is transferred to another contact 1404C on the other area with trace 1404B. Here, a wall can cover the contact 1404A, trace 1404B, and the surface of the micro device for an optical or encapsulation function.

In the above embodiment, the cover walls on the top and bottom surface and the one on the side can be extensions of each other to offer better protection. In another case, the cover wall (layer) used on the side can extend over the bottom or top cover walls (layers).

In summary, the above embodiments provide many ways to encapsulate color conversion layers around the micro devices.

Improved Light Extraction Efficiencies

Further, various embodiments may be provided to improve light extraction efficiencies of micro devices by mounting micro devices at a proximity of a corner of a pixel active area.

According to one embodiment, a pixel structure for a display may be provided. The pixel structure may comprising a substrate, a light source (e.g., a micro device) mounted at the proximity of a corner of a pixel active area or pixel active side to generate light, a color conversion layer and/or color filters may be formed on the micro device to convert the light to a desired color and a top reflector mounted on the color conversion layer and extended over the top of the area of the micro device to reflect the light back toward and through the color conversion layer. The pixel active area is where the light generation or light conversion happens. The pixel active area can be the same as the pixel area.

In another case, a wall can surround part or all of the pixel area. A reflective layer covering the wall while the same or a different reflector layer is covering part of the micro device facing away from the pixel area to reflect the light toward the pixel area. The color conversion layer and/or color filter is formed on part or all of the pixel area.

In one aspect, the top reflector may act as a conductive electrode for coupling the micro device to a signal source such as a voltage or current source. In another embodiment, the reflective layer(s) can be also touch sensor electrodes.

In one embodiment, other layers may be used on top of color conversion layers such as encapsulation layers, color filters, or electrodes for a touch interface.

In another embodiment, a bottom reflector may be disposed between the micro device (pixel area) and the substrate for reflecting the light back from the micro device. This electrode can be another micro device electrode or a touch electrode.

In one case, the top reflector may be patterned to block escape the light from the pixel area.

In another case, if the bottom reflector is a metal, the bottom reflector may act as an electrode. In one embodiment, the bottom reflector may be patterned to open an area to let light be directed outwardly from the micro device.

Figure 15A:
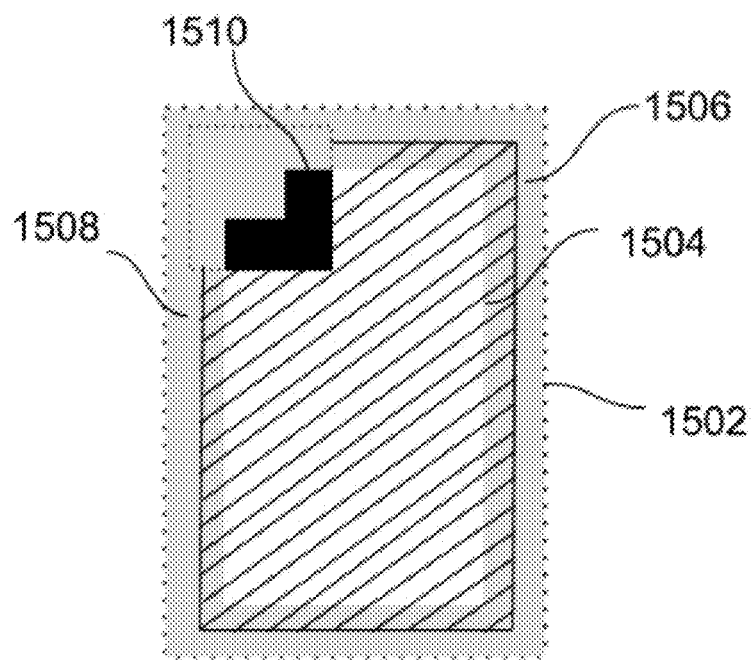
FIG. 15A shows a pixel structure with color conversion layer on top of a micro device in accordance with an embodiment of the present invention.

FIG. 15A shows a pixel structure with color conversion layer on top of a micro device in accordance with an embodiment of the present invention. A pixel structure 1502 comprising a substrate, a micro device 1510 may be mounted at the proximity of a corner of the pixel active area or pixel active side to generate light. The light output surface of the micro device 1510 may be covered by color conversion layers and/or color filters 1504. The color conversion layers may comprise e.g. phosphor or quantum dots (QD). Here, other layers such as encapsulation layers, color filters, or electrodes may be used on top of the color conversion layers. A reflector/reflective layer 1508 may be mounted on the color conversion layers and extended over the top of the area of the micro device to reflect the light back toward and through the color conversion layer. The reflector 1508 may be patterned to block escaping the light out from the pixel area. Being micro device mounted at the proximity of a corner, this pixel structure can offer better light extraction, higher fill factor and better performance.

In one embodiment, a wall(s) 1506 can surround part or all of the pixel area. A reflective layer covering the wall while the same or a different reflector layer is covering part of the micro device facing away from the pixel area to reflect the light toward the pixel area. The color conversion layer and/or color filter is formed on part or all of the pixel area.

In one embodiment, pixel driving backplane can be integrated on top of the sample. In another case, the pixel driving backplane can be integrated before the color conversion layer.

Black matrix can be used on the surface facing away from the light to reduce the reflectivity of the surface for enhancing the contrast.

Figure 15B:
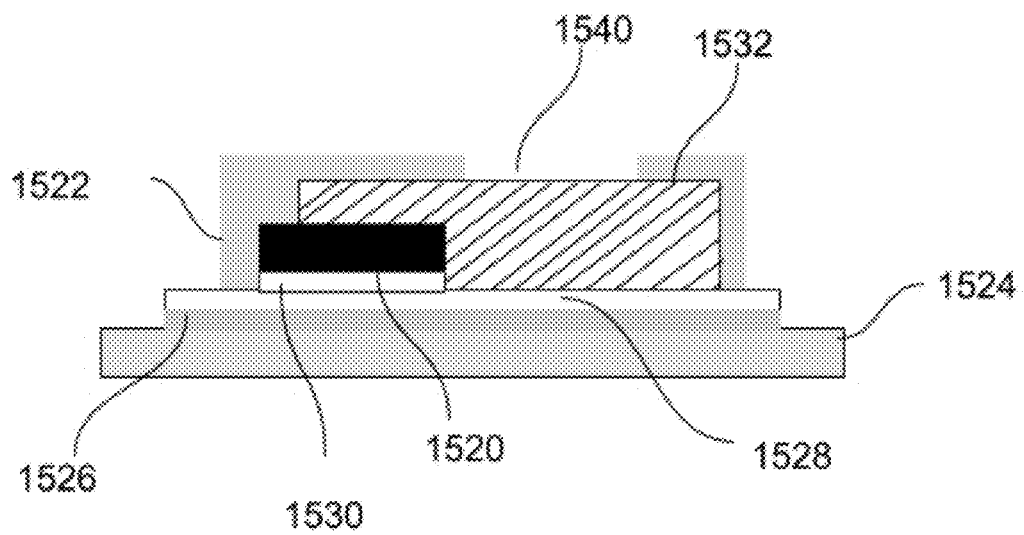
FIG. 15B shows a cross-sectional view of integrating color conversion layers on a substrate in accordance with an embodiment of the present invention.

FIG. 15B shows a cross sectional view of pixel structure including a micro device and color conversion layers corresponding to FIG. 15A. Here, a display substrate may be provided. The substrate 1524 may be an optical substrate that may comprises micro LED or a receiving substrate. The receiving substrate may be, but is not limited to, a printed circuit board (PCB), a thin-film transistor (TFT) backplane, an integrated circuit substrate, or, in one case of optical micro devices, such as LEDs, a component of a display, for example a driving circuitry backplane. A bottom reflector 1526 may be disposed over the substrate used to reflect light back from the micro device. The micro device may be mounted at the proximity of a corner of the pixel area or pixel side to generate light. In one embodiment, an optional dielectric layer 1528 may be deposited over the bottom reflector 1526 to separate the bottom reflector from the micro device.

In one case, if the bottom reflector is a metal, the bottom reflector may act as an electrode to connect the pixel circuit to the micro device. In other embodiments, an optical stage 1530 may be provided on the side of the micro device with some optical property to enhance the light coupling into the color conversion materials.

The color conversion layers 1532 may be mounted on the micro device to convert the light to a desired color. A top reflector 1522 may also be disposed over the color conversion layers to reflect light back from the color conversion layer and may be patterned to open an area 1540 to let light be directed outwardly from the micro device.

In one embodiment, pixel driving backplane can be integrated on top of the sample. In another case, the pixel driving backplane can be integrated before the color conversion layer.

Black matrix can be used on the surface facing away from the light to reduce the reflectivity of the surface for enhancing the contrast.

Figure 15C:
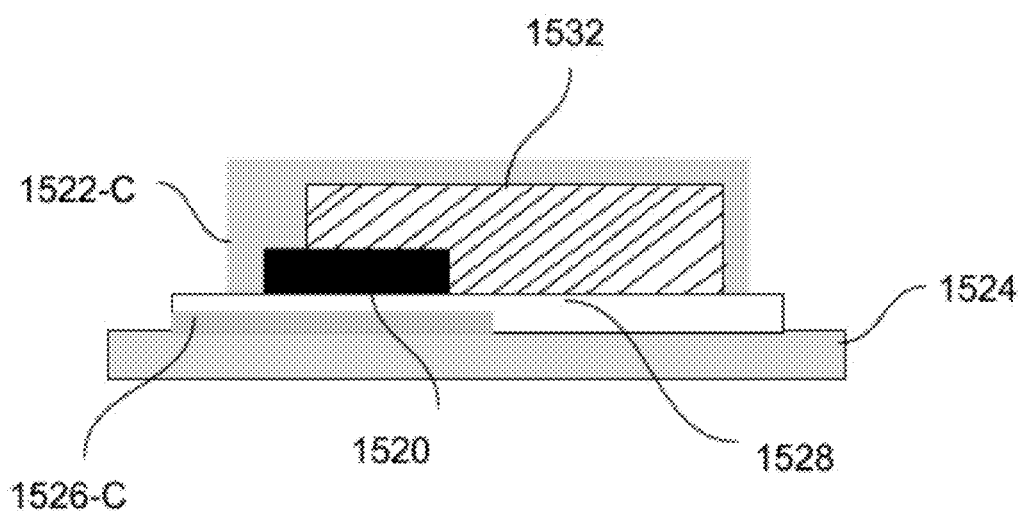
FIG. 15C shows a cross-sectional view of integrating color conversion layers on a substrate in accordance with an embodiment of the present invention.

FIG. 15C shows another cross sectional view of pixel structure. Here, the top reflector 1522-C may be fully disposed on and over on one side of the micro device 1520 and color conversion layers 1532 and the bottom reflector 1526-C may be patterned to open an area to let light be directed outwardly from the micro device.

Figure 15D:
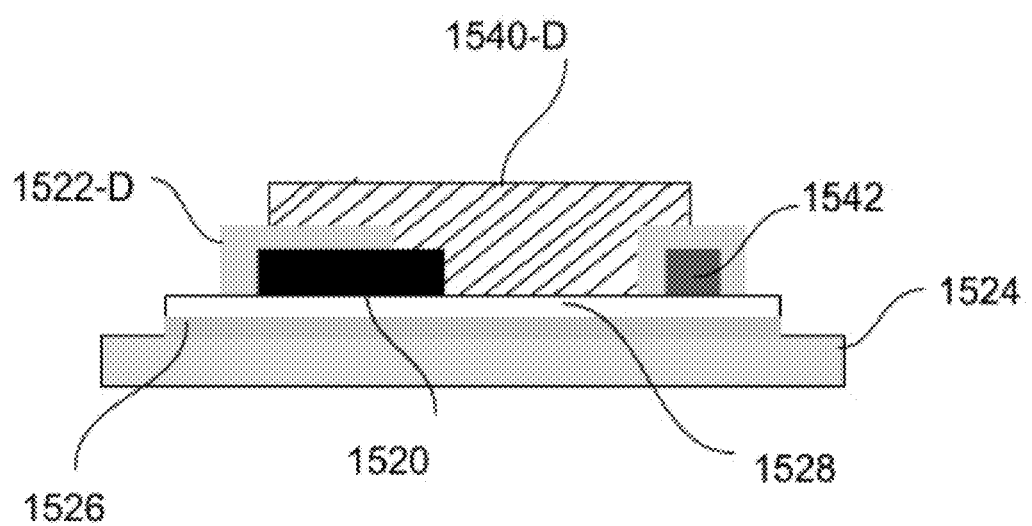
FIG. 15D shows a cross-sectional view of integrating color conversion layers on a substrate in accordance with an embodiment of the present invention.

FIG. 15D shows another cross sectional view of pixel structure. Here, the top reflector 1522-D may be deposited over the micro device 1520 before disposition of the color conversion layers 1540-D. The top reflector 1522-D may be partially patterned and disposed to cover a part of the micro device. An additional plurality of walls/layers 1542 may be provided. These additional walls/layers 1542 may comprises a dielectric layer, a polymer, a stack of metals or another reflector.

Figure 16A:
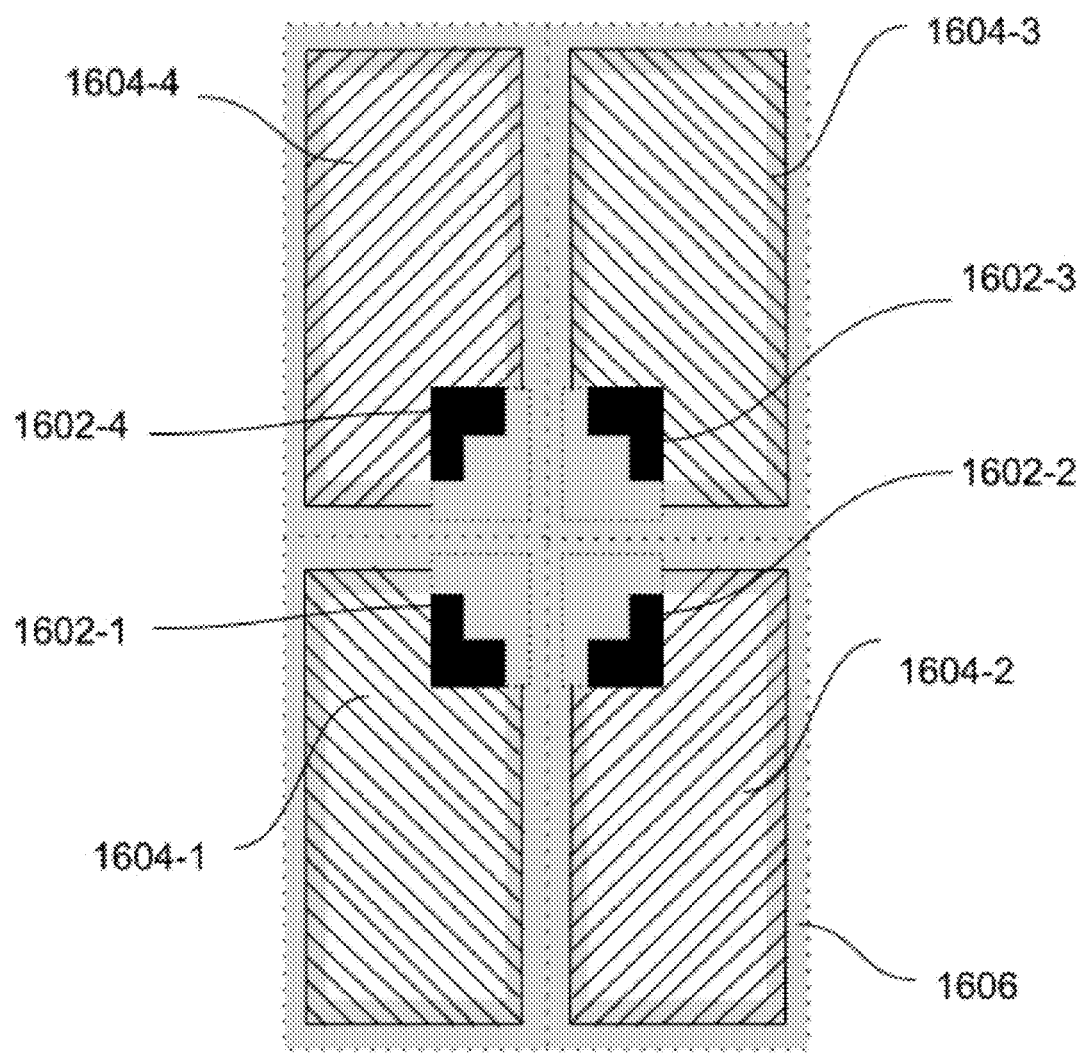
FIG. 16A shows a configuration of a plurality of pixel structures having a common electrode in accordance with an embodiment of the present invention.

FIG. 16A shows a configuration of a plurality of pixel structures having a common electrode either as one of micro device electrode or a touch sensor in accordance with an embodiment of the present invention. Here, for an example, four different pixel structure may be used wherein respective micro device (e.g., 1602-1, 1602-2, 1602-3 and 1602-4) is mounted on the proximity of a corner of each pixel structure. The pixel structures mounted in such a way that light output surface of each micro device is facing each other. The light output surface of each micro device may be covered by respective color conversion layers and/or color filters (e.g., 1604-1, 1604-2, 1604-3 and 1604-4). The top reflector mounted on color conversion layer of each pixel structure may act as an electrode and may also act as a common electrode 1606 for each pixel structure to connect to the micro device.

In one case, the reflective layer(s) can be also touch sensor electrodes. The micro devices can be located in different corners of the pixels (or sub pixels). In this embodiment, the micro devices in one pixel for different sub pixels are located closer to each other.

Figure 16B:
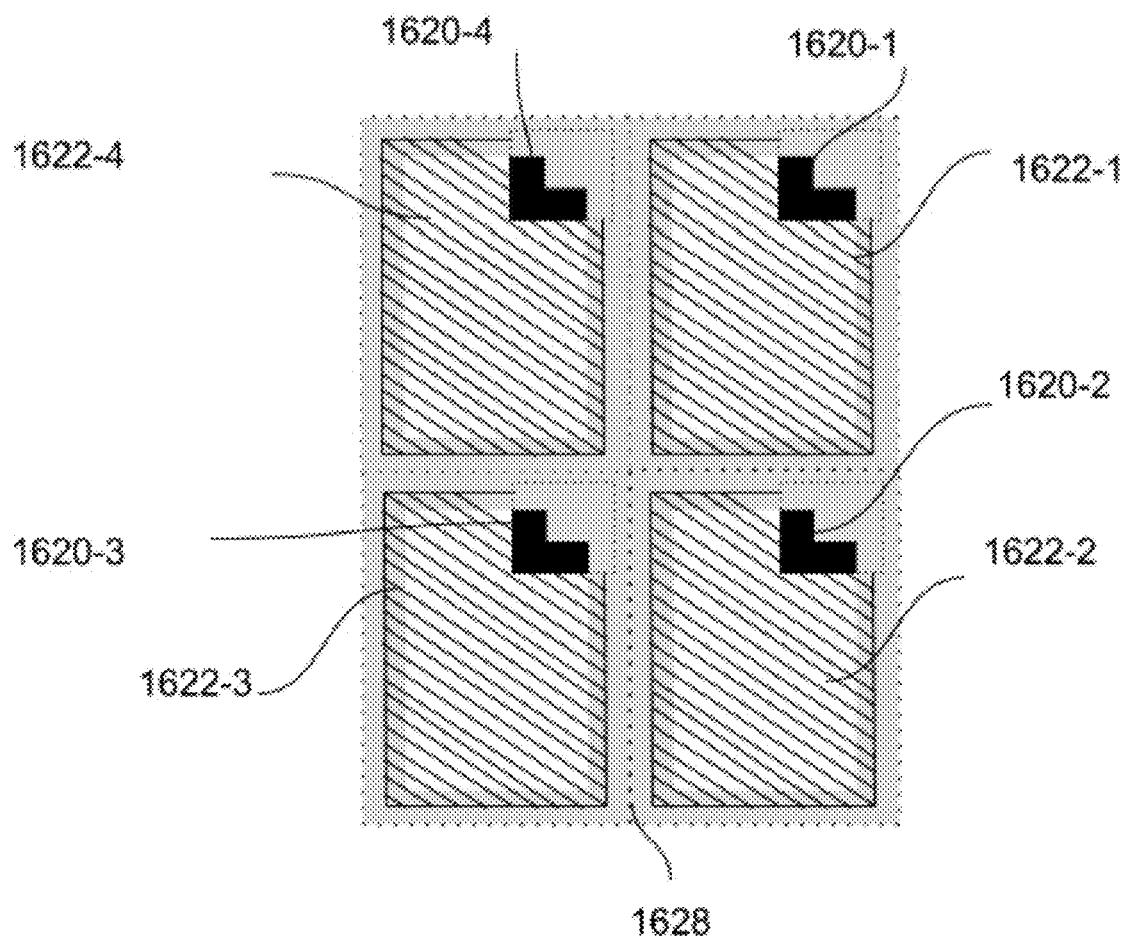
FIG. 16B shows another configuration of a plurality of pixel structures having a common electrode in accordance with an embodiment of the present invention.

FIG. 16B shows another configuration of a plurality of pixel structures having a common electrode in accordance with an embodiment of the present invention. In this case, the micro devices in subpixels related to one pixel can be further away from each other as demonstrated in FIG. 16B. The top reflector can cover part of the micro device specially if it only covering the micro device.

Figure 16C:
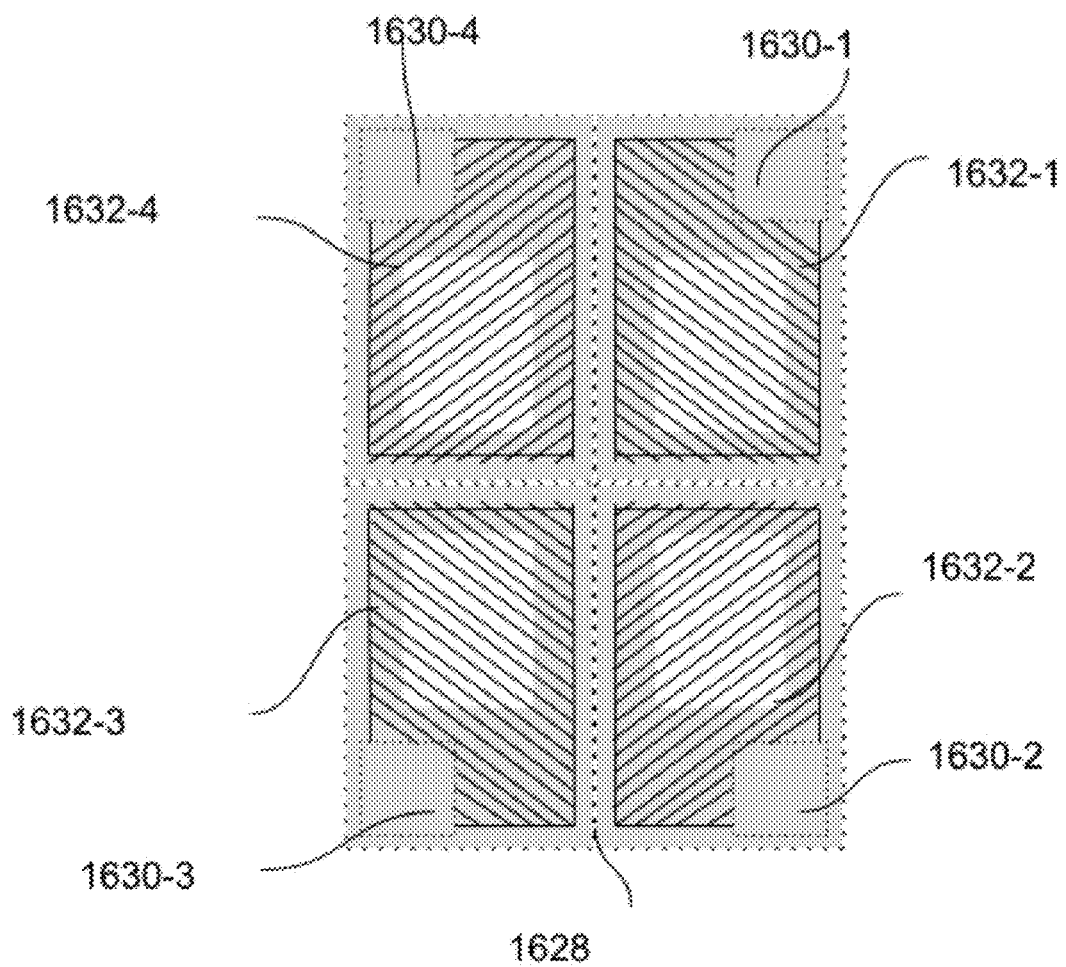
FIG. 16C shows another configuration of a plurality of pixel structures having a common electrode in accordance with an embodiment of the present invention.

FIG. 16C shows another configuration of a plurality of pixel structures having a common electrode in accordance with an embodiment of the present invention. In this case, the top reflector or an extra reflector covering QD layers can extend over the micro device.

In summary, the above embodiments provide many ways to mount micro devices at a proximity of a corner of a pixel active area to improve light extraction efficiencies of micro devices.

Optical Layer Integration with Micro Device Substrate

Furthermore, this disclosure is related to integration of optical layer(s) in a micro device structure. The micro device structure may comprise micro light emitting diodes (LEDs), organic LEDs, sensors, solid state devices, integrated circuits, MEMS, and/or other electronic components.

In one embodiment, the micro device may comprise at least one color conversion layers. In one embodiment, color conversion layers may include phosphor or quantum dots (QD). In another embodiment, the micro device may comprise one or more optical layers.

In yet another embodiment, a first optical layer may couple micro device light into the micro device structure and reflect the light created by a first color conversion layer towards a second optical layer.

In another embodiment, the second optical layer may couple remaining light from the LED and light generated by the first color conversion layer into a second color conversion layer. It may prevent the light from the second color conversion layer to go back to the first color conversion layer.

In one embodiment, the first color conversion layer may generate a higher wavelength light e.g, red and the second color conversion layer may generate a mid range wavelength light e.g, green.

In one case, color conversion layers may be color conversion layers embedded in a film (e.g. polymers). In another case, color conversion layers may be a continuous layer (e.g. mono layer) covered by passivation layer.

In another embodiment, the first color conversion layer may generate mid range wavelength (e.g. green) and the second color conversion layer may generate longer wavelengths (e.g. red).

In this case, the light generated by the first color conversion layer may also be converted by the second color conversion layer into longer wavelength light. Therefore, the second color conversion layer concentration may be controlled to only convert predefined percentage of the first color conversion layer light into the second color conversion layer light.

In yet another embodiment, the light entity of the first color conversion layer or a second color conversion layer light may also be modulated by adding a third optical film on top of the structure (for this structure, the first color conversion layer or a second color conversion layer can be mixed in one film as well). For example, for area where more red is needed, an optical film can be added on the top to reflect a percentage the light (either as selective by wavelength or general) back into the QD films. In such case, the mid wavelength (e.g. green) will be absorbed more by the QD films and generate more longer wavelength light (e.g. red). Various embodiments in accordance with the present structures and processes provided are described below in detail.

Figure 17:
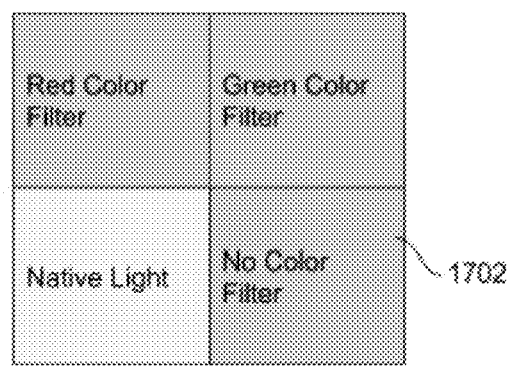
FIG. 17 shows an arrangement of color conversion films in a micro device structure, in accordance with an embodiment of the present invention.

FIG. 17 shows an arrangement of color conversion films/color filters in a micro device structure, according to one embodiment of the invention. Here, a color conversion layer is used to convert the blue light of three subpixels to combine green and red color. The color filter is for each sub pixel to only allow the corresponding light out. To save power, one sub pixel has no color filter 1702. In this case, if a pixel required a combination of red and green color, the sub pixel with no color filter can be used to generate all or part of the combined color. Furthermore, one sub pixel has no color conversion and therefore generate blue color only.

Figure 18A:
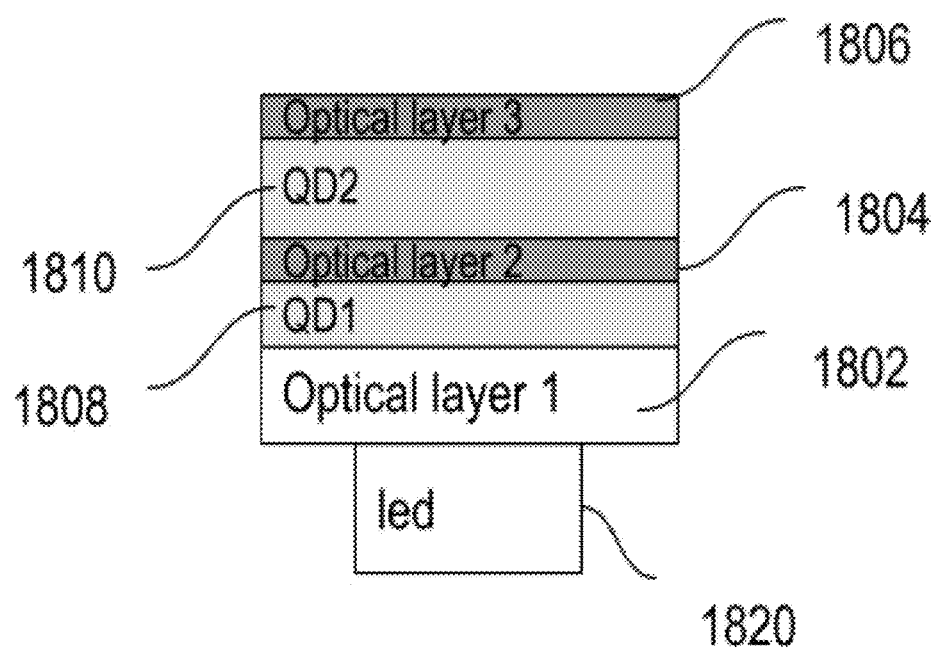
FIG. 18A shows an arrangement of QD films with optical layers in a micro device structure, in accordance with an embodiment of the present invention.

FIG. 18A shows an arrangement of QD films with optical layers in a micro device structure, in accordance with an embodiment of the present invention. Here, the micro device 1820 may comprise one or more optical layers. A first optical layer 1802 may couple micro device 1820 light into the micro device structure and reflect the light created by a first color conversion layer 1802 towards a second optical layer 1804. The second optical layer 1804 may couple remaining light from the LED and light generated by the first color conversion layer 1808 into a second color conversion layer 1810. It may prevent the light from the second color conversion layer 1810 to go back to the first color conversion layer 1808.

In one embodiment, the first color conversion layer 1808 may generate a higher wavelength light e.g., red and the second color conversion layer 1810 may generate a mid-range wavelength light e.g., green. In one case, color conversion layers may be color conversion layers embedded in a film (e.g. polymers). In another case, color conversion layers may be a continuous layer (e.g. mono layer) covered by passivation layer. In another embodiment, the first color conversion layer 1808 may generate mid-range wavelength (e.g. green) and the second color conversion layer 1810 may generate longer wavelengths (e.g. red).

In this case, the light generated by the first color conversion layer 1808 may also be converted by the second color conversion layer 1810 into longer wavelength light. Therefore, the second color conversion layer concentration may be controlled to only convert predefined percentage of the first color conversion layer light into the second color conversion layer light.

In yet another embodiment, the light entity of the first color conversion layer or a second color conversion layer light may also be modulated by adding a third optical film 1806 on top of the structure (for this structure, the first color conversion layer or a second color conversion layer can be mixed in one film as well). For example, for area that more red is needed, an optical film can be added on the top to reflect a percentage the light (either as selective by wavelength or general) back into the QD films. In such case, the mid wavelength (e.g. green) will be absorbed more by the QD films and generate more longer wavelength light (e.g. red).

Figure 18B:
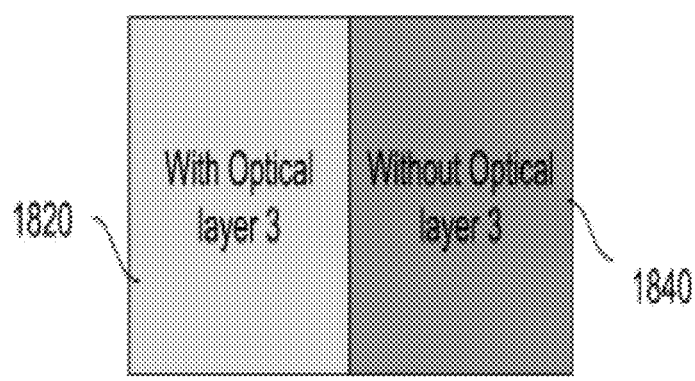
FIG. 18B shows an arrangement of optical layers in a micro device structure, in accordance with an embodiment of the present invention.

FIG. 18B shows an arrangement of optical layers in a micro device structure, in accordance with an embodiment of the present invention. Here, the sub pixel with no optical layer 3 1840 creates more of higher wavelength (green) color, while the sub pixel with optical layer 3 1820 creates more lower wavelength (red) color.

According to one embodiment, an optoelectronic device is provided. The optoelectronic device comprises a plurality of semiconductor layers formed on a substrate to form a top surface and a bottom surface, wherein the plurality of semiconductor layers have isolated areas that form at least one side surface; one or more cover layers form a space around the isolated areas optically coupled to the at least one side surface; and functional tuning materials are disposed in the space formed by the one or more cover layers.

According to another embodiment, the one or more cover layers comprises one or more of: a passivation layer, a dielectric layer, an optical enhancement layer, an encapsulation layer, a reflective layer, and a color filter layer, and functional tuning materials comprises color conversion materials.

According to some embodiments, the functional tuning materials are further disposed on one of: the top surface or the bottom surface of the optoelectronic device.

According to further embodiments, the at least one contact is disposed on at least one of: the top surface or the bottom surface of the optoelectronic device and a pad is coupled to the optoelectronic device through the at least one contact.

According to another embodiment, the height of the at least one contact is extendable beyond the functional tuning materials disposed on a same side of the at least one contact and wherein the at least one contact on one of: the top surface or the bottom surface of the optoelectronic device is connected to a least another contact on another surface of the optoelectronic device through a trace. The trace is separated from the optoelectronic device by a dielectric layer.

According to some embodiments, the encapsulation layer protects the color conversion materials from oxygen and moisture, the optical enhancement layer reflects the light into the color conversion materials, the reflective layer enhances the light coupling into the color conversion materials, and the reflective layer is extended on one of: the top surface or the bottom surface of the optoelectronic device. The reflective layer comprises a reflective part and a transparent part.

According to other embodiments, the plurality of cover layers is deposited by one of: printing, evaporation, or sputtering and patterned by one of: photolithography, liftoff, or printing.

According to further embodiments, the one or more cover layers encircling the functional tuning materials between the at least one side surface and the one or more cover layers.

According to one embodiment, a display may be provided. The display may comprising: a substrate, at least one pixel structure disposed on or over the substrate, each pixel structure including at least one micro device mounted in proximity of a corner of the pixel structure, at least one color conversion layer mounted on the at least one micro device; and a top reflector mounted on the color conversion layer extended over the top of the area of the micro device.

According to another embodiment, the display may further comprise at least a wall surrounding a part or a whole of the pixel structure, a reflective layer covering the wall to reflect back the light towards the pixel structure. The top reflector is a conductive electrode for coupling the micro device to a signal source and the reflective layer is a touch sensor electrode.

According to yet another embodiment, the display may further comprise a bottom reflector disposed between the micro device and the substrate for reflecting the light back from the micro device. The bottom reflector is used as an electrode. The top reflector is patterned to open an area to let light be directed outwardly from the pixel area. The bottom reflector is patterned to open an area to let light be directed outwardly from the micro device. The wall comprises a dielectric layer, a polymer, a stack of metals or another reflector.

According to one embodiment, a plurality of optical layers may be coupled with the micro device. The optical layers are disposed in between color conversion layers.

In summary, the disclosure is related to creating different functional micro devices by integrating functional tuning materials and creating an encapsulation capsule to protect these materials. Various embodiments of the present disclosure also related to improve light extraction efficiencies of micro devices by mounting micro devices at a proximity of a corner of a pixel active area and arranging QD films with optical layers in a micro device structure.

The foregoing description of one or more embodiments of the invention has been presented for the purposes of illustration and description. It is not intended to be exhaustive or to limit the invention to the precise form disclosed. Many modifications and variations are possible in light of the above teachings. It is intended that the scope of the invention be limited not by this detailed description, but rather by the claims appended hereto.

We claim:

1. A method to integrate color conversion films with optical layers in a micro device structure, the method comprising:
   having the micro device comprising of one or more optical layers;
   coupling a micro device light by a first optical layer into the micro device structure and reflect a light created by a first color conversion layer towards a second optical layer;
   coupling a remaining light from an LED and light generated by the first color conversion layer into a second color conversion layer; and
   preventing the light from the second color conversion layer to go back to the first color conversion layer.

2. The method of claim 1, wherein the first color conversion layer generates a higher wavelength light and the second color conversion layer generates a mid-range wavelength light.

3. The method of claim 2, wherein the color conversion layers are color conversion layers embedded in a film.

4. The method of claim 2, wherein the color conversion layers are a continuous layer) covered by a passivation layer.

5. The method of claim 1, wherein the first color conversion layer generates a mid-range wavelength light and the second color conversion layer generates a longer wavelength light.

6. The method of claim 5, wherein the light generated by the first color conversion layer is also converted by the second color conversion layer into the longer wavelength light.

7. The method of claim 5, wherein a second color conversion layer concentration is controlled to only convert a predefined percentage of the first color conversion layer light into the second color conversion layer light.

8. The method of claim 1, wherein the light of the first color conversion layer or a second color conversion layer light is modulated by adding a third optical film on top of the micro device structure.

9. The method of claim 8, wherein the for an area requiring more red, an optical film is added on the top to reflect a percentage of the light back into the color conversion films.

10. The method of claim 9, wherein a mid wavelength is absorbed more by the color conversion films and generating a longer wavelength light.

11. The method of claim 8, wherein a sub pixel with no third optical film creates a higher wavelength color, while the sub pixel with the third optical film creates a lower wavelength color.

12. The method of claim 1, where the color conversion film is quantum dot film.

* * * * *